(12) United States Patent
Fan et al.

(10) Patent No.: US 12,283,336 B2
(45) Date of Patent: *Apr. 22, 2025

(54) SYSTEM FOR DIFFERENTIATED THERMAL THROTTLING OF MEMORY AND METHOD OF OPERATING SAME

(71) Applicant: TAIWAN SEMICONDUCTOR MANUFACTURING COMPANY, LTD., Hsinchu (TW)

(72) Inventors: Philex Ming-Yan Fan, Hsinchu (TW); Chia-En Huang, Hsinchu (TW); Yih Wang, Hsinchu (TW); Jonathan Tsung-Yung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/439,982

(22) Filed: Feb. 13, 2024

(65) Prior Publication Data
US 2024/0185895 A1 Jun. 6, 2024

Related U.S. Application Data

(63) Continuation of application No. 17/680,044, filed on Feb. 24, 2022, now Pat. No. 11,901,035.
(Continued)

(51) Int. Cl.
*G11C 7/04* (2006.01)
*G06F 1/20* (2006.01)
*G11C 7/22* (2006.01)

(52) U.S. Cl.
CPC ............ *G11C 7/04* (2013.01); *G06F 1/206* (2013.01); *G11C 7/22* (2013.01)

(58) Field of Classification Search
CPC .. G11C 7/04; G11C 7/22; G11C 5/147; G11C 5/04; G11C 11/4074;
(Continued)

(56) References Cited

U.S. PATENT DOCUMENTS

| 7,260,442 B2 | 8/2007 | Hwang et al. |
| 8,183,910 B2 | 5/2012 | Chung et al. |

(Continued)

FOREIGN PATENT DOCUMENTS

| CN | 107656878 | 2/2018 |
| KR | 20140015880 | 2/2014 |

(Continued)

OTHER PUBLICATIONS

K. Sohn et al., "18.2 A 1.2V 20nm 307GB/s HBM DRAM with at-speed wafer-level I/O test scheme and adaptive refresh considering temperature distribution," 2016 IEEE International Solid-State Circuits Conference (ISSCC), 2016, pp. 316-317, doi: 10.1109/ISSCC.2016.7418034.

(Continued)

*Primary Examiner* — Huan Hoang
(74) *Attorney, Agent, or Firm* — Hauptman Ham, LLP

(57) ABSTRACT

A system includes a high bandwidth memory (HBM) arranged into portions including memory cells, the HBM further including a differentiated dynamic voltage and frequency scaling (DDVFS) device to perform the following: for a first set of one or more of the memory cells in a first one of the portions, the first set including a first one of the memory cells, controlling a temperature of the first set based on one or more first environmental signals corresponding to at least a first transistor in the first memory cell; and for a second set of one or more of the memory cells in a second one of the portions, the second set including a second one of memory cells, controlling a temperature of the second set
(Continued)

based on one or more second environmental signals corresponding to at least a second transistor in the second memory cell.

20 Claims, 29 Drawing Sheets

Related U.S. Application Data

(60) Provisional application No. 63/220,033, filed on Jul. 9, 2021.

(58) Field of Classification Search
CPC . G11C 11/4076; G11C 16/0483; G06F 1/206; G06F 1/04; G06F 1/20; G06F 1/26; Y02D 10/00
USPC ............................................... 365/244
See application file for complete search history.

(56) References Cited

U.S. PATENT DOCUMENTS

| | | | |
|---|---|---|---|
| 9,166,067 B2 | 10/2015 | Horng et al. | |
| 9,256,709 B2 | 2/2016 | Yu et al. | |
| 10,180,906 B2 | 1/2019 | Stocksdale et al. | |
| 11,901,035 B2* | 2/2024 | Fan ........................ | G11C 7/22 |
| 2014/0022002 A1 | 1/2014 | Chua-Eoan et al. | |
| 2014/0040838 A1 | 2/2014 | Liu et al. | |
| 2015/0278429 A1 | 10/2015 | Chang | |
| 2017/0234816 A1 | 8/2017 | Seok et al. | |
| 2020/0027500 A1 | 1/2020 | Heymann et al. | |
| 2020/0082885 A1 | 3/2020 | Lin et al. | |
| 2020/0129770 A1 | 4/2020 | Opris et al. | |
| 2021/0247978 A1 | 8/2021 | Malladi et al. | |

FOREIGN PATENT DOCUMENTS

| | | |
|---|---|---|
| KR | 20140042979 | 4/2014 |
| TW | 201830246 | 8/2018 |

OTHER PUBLICATIONS

K. Sohn et al., "A 1.2 V 20 nm 307 GB/s HBM DRAM With At-Speed Wafer-Level IO Test Scheme and Adaptive Refresh Considering Temperature Distribution," in IEEE Journal of Solid-State Circuits, vol. 52, No. 1, pp. 250-260, Jan. 2017, doi: 10.1109/JSSC.2016.2602221.

D. U. Lee et al., "A 1.2 V 8 GB 8-Channel 128 GB/s High-Bandwidth Memory (HBM) Stacked DRAM With Effective I/O Test Circuits," IEEE Journal of Solid-State Circuits, vol. 50, No. 1, pp. 191-203, Jan. 2015, doi= 10.1109/ JSSC.2014.2360379, URL= https://dl.acm.org/servlet/linkout?suffix=e_1_3_2_1_21_1&dbid=16&doi=10.1145%2F2989081.2989112&key=10.1109%2FJSSC.2014.2360379.

\* cited by examiner

704A Adjust 1st clock and/or 1st PS voltage

730
Compare 1st temperature against 1st temperature-reference representing maximum temperature yielding 1st temperature-comparison results

732
Alter frequency of 1st clock based on 1st temperature-comparison results

734
Alter value of 1st PS voltage based on 1st temperature-comparison results

706A Adjust 2nd clock and/or 2nd PS voltage

736
Compare 2nd temperature against 1st temperature-reference yielding 2nd temperature-comparison results

738
Alter frequency of 2nd clock based on 2nd temperature-comparison results

740
Alter value of 2nd PS voltage based on 2nd temperature-comparison results

FIG. 7F

704A Adjust 1st clock and/or 1st PS voltage

750
Compare 1st threshold-voltage against 1st threshold-voltage-reference representing minimum threshold-voltage yielding 1st threshold-voltage-comparison results

752
Alter frequency of 1st clock based on 1st threshold-voltage comparison results

754
Alter value of 1st PS voltage based on 1st threshold-voltage-comparison results

706A Adjust 2nd clock and/or 2nd PS voltage

756
Compare 2nd threshold-voltage against 1st threshold-voltage-reference yielding 2nd threshold-voltage-comparison results

758
Alter frequency of 2nd clock based on 2nd threshold-voltage-comparison results

760
Alter value of 2nd PS voltage based on 2nd threshold-voltage-comparison results

FIG. 7G

704A Adjust 1st clock and/or 1st PS voltage

770
Compare 1st temperature against 2nd temperature-reference representing moderate temperature yielding 3rd temperature-comparison results

↓

772
Increase frequency of 1st clock when 3rd temperature-comparison results indicate that 1st temperature is below 2nd temperature-reference

↓

774
Increase value of 1st PS voltage when 3rd temperature-comparison results indicate that 1st temperature is below 2nd temperature-reference

↓

706A Adjust 2nd clock and/or 2nd PS voltage

776
Compare 2nd temperature against 2nd temperature-reference yielding 4th temperature-comparison results

↓

778
Increase frequency of 2nd clock when 4th temperature-comparison results indicate that 2nd temperature is below 2nd temperature-reference

↓

780
Increase value of 2nd PS voltage when 4th temperature-comparison results indicate that 2nd temperature is below 2nd temperature-reference

FIG. 7H

704A Adjust 1st clock and/or 1st PS voltage

790 All members of 1st set are idle?

↓ YES

792 When all members of 1st set are idle, reduce frequency of 1st clock

794 When all members of 1st set are idle, reduce value of 1st PS voltage

706A Adjust 2nd clock and/or 2nd PS voltage

796 All members of 2nd set are idle?

↓ YES

798 When all members of 2st set are idle, reduce frequency of 2nd clock

799 When all members of 2nd set are idle, reduce value of 2nd PS voltage

FIG. 7I

SYSTEM FOR DIFFERENTIATED THERMAL THROTTLING OF MEMORY AND METHOD OF OPERATING SAME

PRIORITY CLAIM

The present application is a continuation of U.S. patent application Ser. No. 17/680,044, filed Feb. 24, 2022, now U.S. Pat. No. 11,901,035, issued filed Feb. 13, 2024, that claims the priority of U.S. Provisional Application No. 63/220,033, filed Jul. 9, 2021, each of which is incorporated herein by reference in its entirety.

BACKGROUND

An integrated circuit ("IC") includes one or more semiconductor devices. One way in which to represent a semiconductor device is with a plan view diagram referred to as a layout diagram.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7F-7I are corresponding flowcharts showing blocks of FIG. 7A in more detail, in accordance with some embodiments.

DETAILED DESCRIPTION

Figure 1:
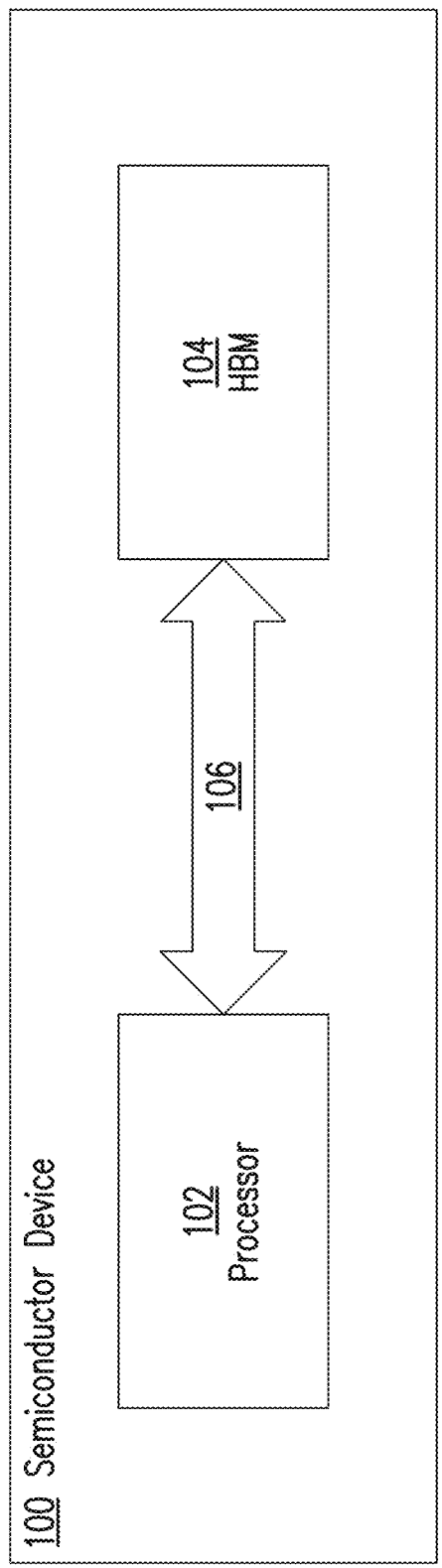
FIG. 1 is a block diagram of a semiconductor device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a high-bandwidth memory (HBM) includes a stack of core dies/chips/ICs, e.g., dynamic random access memory (DRAM) core dies and a differentiated DVFS device, where DVFS is an acronym for dynamic voltage and frequency scaling (DVFS). Banks of the core dies include sensing units (each including a temperature sensor and/or a threshold voltage detector). In general, frequent read or write activity at a memory cell in a core die raises the temperature of the memory cell. An unchecked/ uncontrolled increase in temperature can lead to thermal runaway. When the temperature of a memory cell in a core die exceeds a permissible maximum temperature, the value of the data bit stored in the memory cell is susceptible to becoming corrupted, e.g., due to increased leakage, or the like. According to another approach, a technique referred to as monolithic DVFS is used to prevent overheating in an HBM. The monolithic DVFS technique according to the other approach monitors temperatures in each of the core dies of the HBM. When a portion of any core die exceeds a permissible temperature, the monolithic DVFS technique of the other approach reduces the clock of all the bit cells of all the core dies, wherein the clock is reduced by decreasing the frequency of the clock that is supplied to all of the core dies. The monolithic DVFS technique according to the other approach is described as a monolithic type of thermal throttling because the same clock provided to all of the bit cells of all the core dies thereby treating the HMB as if the HMB is a monolith, i.e., not treating the HBM of the other approach as including different portions which behave differently.

Often, however, the portion of a given core die which exceeds the permissible temperature is a minority portion of the given core die. As a result, the monolithic thermal throttling according to the other approach not only cools the minority portion of the given core die, but also unnecessarily cools the majority portion of the given core die and the entireties of the other core dies, resulting in unnecessarily diminished performance of the majority portion of the given core die and the entireties of the other core dies, which is wasteful and inefficient. In contrast to the monolithic thermal throttling of the other approach, in terms of portions of the HBM whose temperatures are to be controlled, the differentiated thermal throttling of some embodiments, e.g., bank-wide, group-wide, channel-wide, core-wide, or the like, is more granular, and thus is less wasteful and more efficient.

FIG. 1 is a block diagram of a semiconductor device 100 in accordance with at least one embodiment of the present disclosure.

In FIG. 1, semiconductor device 100 includes, among other things, a processor 102 and a high-bandwidth memory (HBM) 104 operationally coupled together by a bus 106. In some embodiments, semiconductor device 100 is a system-in-package (SIP) type of semiconductor device. In some embodiments, semiconductor device 100 is a compute-in-memory (CIM) system. An example of semiconductor device 102 is shown in FIG. 2A, or the like.

Figure 2A:
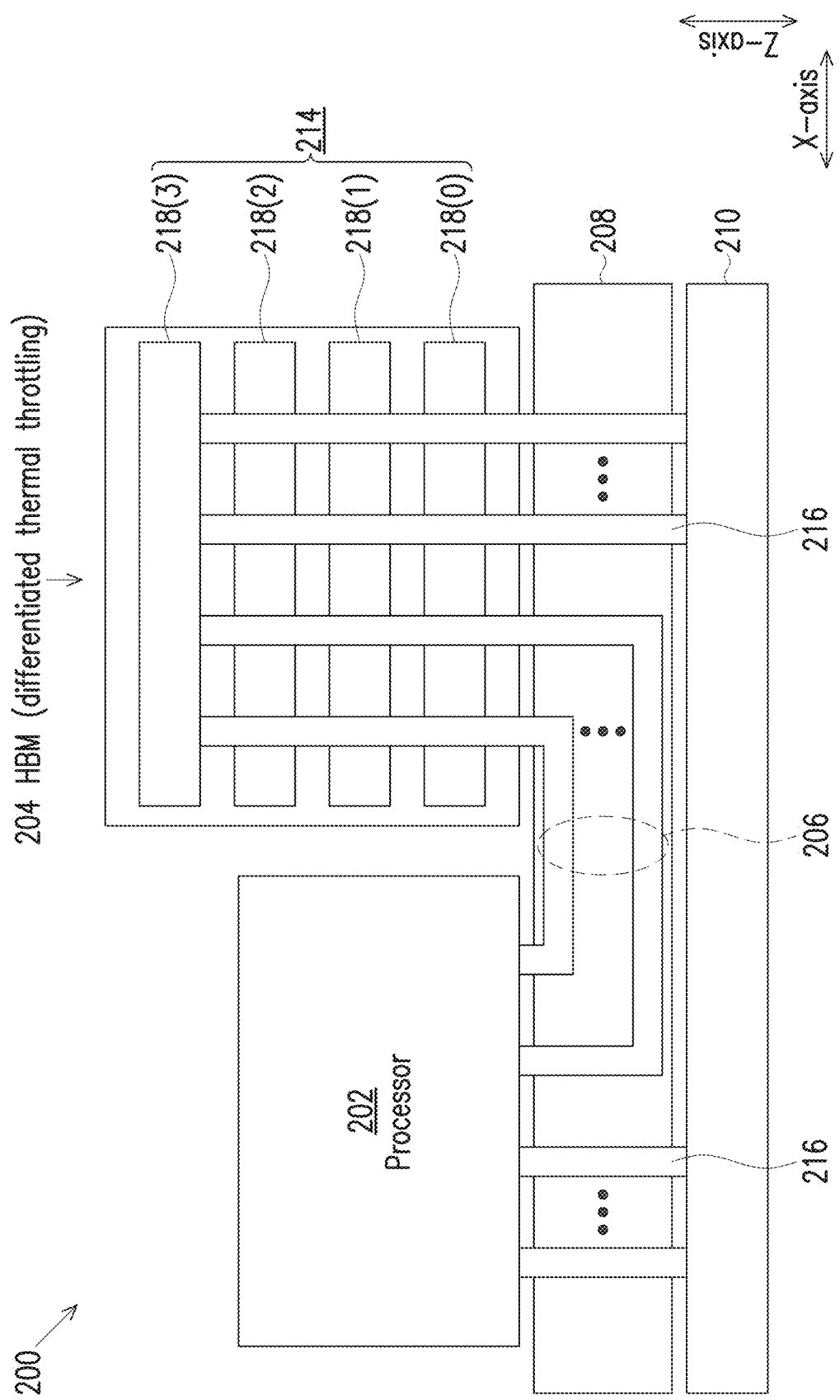
FIG. 2A is a cross-sectional view of a semiconductor device, in accordance with some embodiments.

FIG. 2A is a cross-sectional view of a semiconductor device 200, in accordance with some embodiments.

More particularly, semiconductor device 200 is a SIP type of semiconductor device. SIP 200 includes a processor 202 and an HBM 204 operationally coupled together by a bus 206. SIP 200 is an example of semiconductor device 100 of FIG. 1. In some embodiments, SIP 200 is a compute-in-memory (CIM) system. Processor 202 is an example of processor 102 of FIG. 1. HBM 204 is an example of HBM 104 of FIG. 1. Bus 206 is an example of bus 106 of FIG. 1. In some embodiments, processor 202 is a central processing unit (CPU). In some embodiments, processor 202 is a graphics processing unit (GPU). In some embodiments, processor 202 is a visual processing unit (VPU). In some embodiments, processor 202 is a general purpose graphics processing unit (GPGPU).

In FIG. 2A, SIP 200 further includes an interposer structure 208 and a printed circuit board (PCB) 210. Interposer structure 208 is formed over PCB 210. Interposer 208 is formed of a semiconductor, e.g., silicon. Interposer 208 includes portions of signal lines which comprise bus 206, and portions of signal lines 216. In some embodiments, signals on bus 206 are communicated internally with respect to SIP 200. Accordingly, in such embodiments, the signal lines of SIP 200 are described as intra-SIP signal lines. In some embodiments, the signals on at least some of signal lines 216 are communicated externally with respect to SIP 200. Accordingly, in such embodiments, signal lines of SIP 200 are generally described as extra-SIP signal lines though not every signal line 216 necessarily carries a signal which is communicated externally with respect to SIP 200.

In FIG. 2A, HBM 204 includes a stack 214 of four core dies 218(1), 218(2), 218(3) and 218(4). In some embodiments, HBM 204 includes a buffer die (FIG. 2B) under stack 214. In some embodiments, stack 214 includes two or three or five or more core dies. HBM 204 further includes one or more differentiated dynamic voltage and frequency scaling (DDVFS) devices (see FIGS. 3A-3D).

Figure 2B:
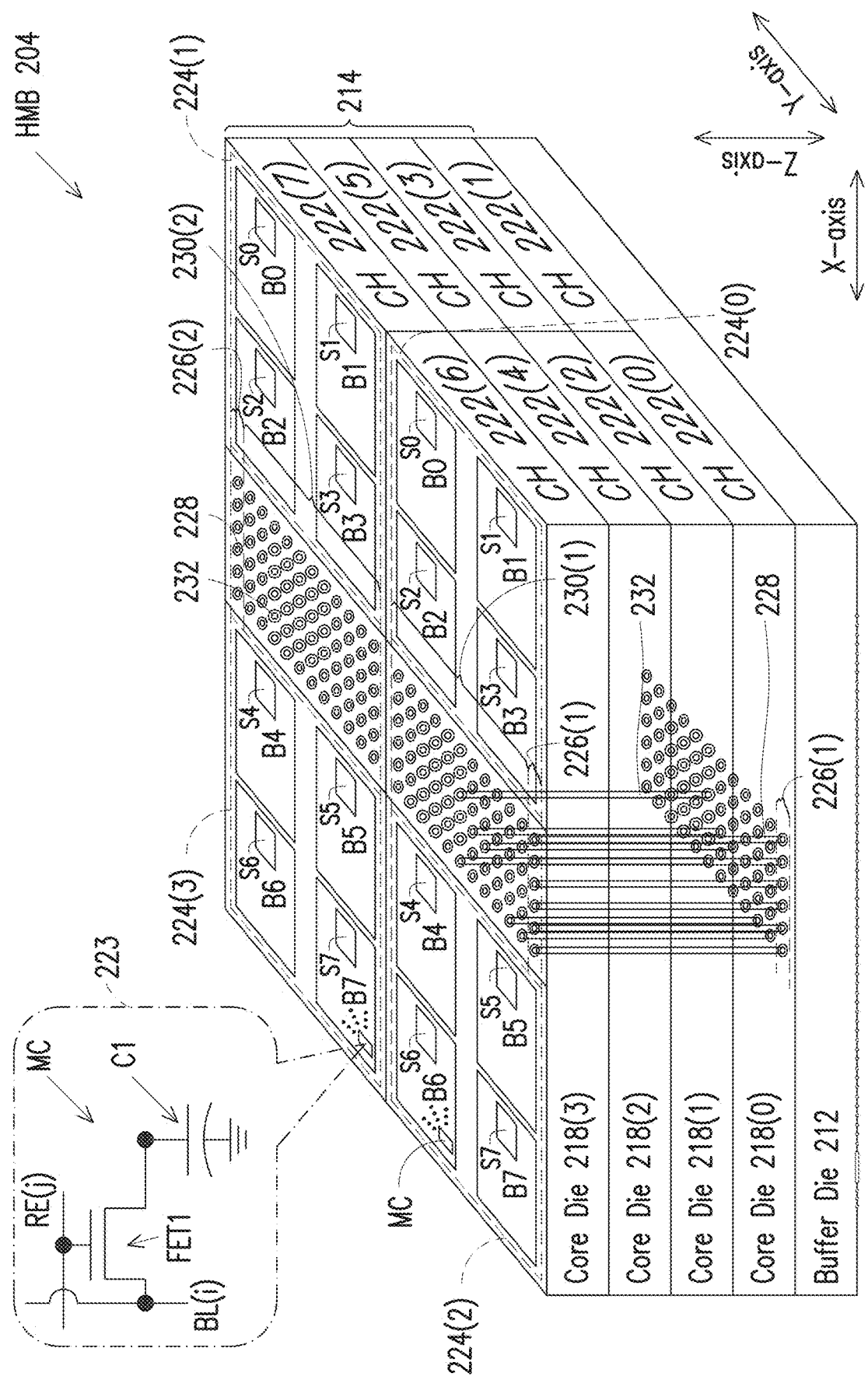
FIG. 2B is a three-quarter perspective view of an HBM, in accordance with some embodiments.

FIG. 2B is a three-quarter perspective view of HBM 204, in accordance with some embodiments.

In FIG. 2B, each of core dies 218(1)-218(4) includes memory cells MC which are arranged/organized into two channels of eight banks B0-B7. Each channel is arranged into two groups of banks. Accordingly, HBM 204 includes eight channels 222(0)-222(7). More particularly, core die 218(0) is arranged into channels 222(0) and 222(1); core die 218(1) is arranged into channels 222(2) and 222(3); core die 218(2) is arranged into channels 222(4) and 222(5); and core die 218(3) is arranged into channels 222(6) and 222(7).

Also, accordingly, for example, core die 218(3) includes four groups of banks. More particularly, channel 222(6) of core die 218(3) includes: group 224(0) comprised of banks B0-B3; and group 222(4) comprised of banks B4-B7. Channel 222(7) of core die 218(3) includes: group 224(1) comprised of banks B0-B3; and group 222(3) comprised of banks B4-B7. Relative to the X-axis shown in FIG. 2B, group 224(2) is on the left side of channel 222(6) and group 224(0) is on the right side of channel 222(6). Similarly, group 224(3) is on the left side of channel 222(7) and group 224(1) is on the right side of channel 222(7). In some embodiments, groups 224(2) and 224(3) are referred to as left-side groups and groups 224(0) and 224(1) are referred to as right-side groups.

In some embodiments, an aggregation of one or more but fewer than all of the banks in an HBM is referred to as a lot. In some embodiments, an aggregation of one or more but fewer than all of the groups in an HBM is referred to as a batch. In some embodiments, an aggregation of one or more but fewer than all of the channels in an HBM is referred to as a bundle. In some embodiments, an aggregation of one or more but fewer than all of the core-dies in an HBM is referred to as a collection.

In FIG. 2B, HBM 204 further includes arrays 226(1) and 226(2) of through-silicon vias (TSVs) 228, or the like, and arrays 230(1) and 230(2) of TSVs 232, or the like. Relative to the X-axis, arrays 226(1) and 230(1) are between the left and right groups of each of channel 222(6) of core die 218(3), channel 222(4) of core die 218(2), channel 222(2) of core die 218(1), and channel 222(0) of core die 218(0). Similarly, arrays 226(2) and 230(2) are between the left and right groups of each of channel 222(7) of core die 218(3), channel 222(6) of core die 218(2), channel 222(3) of core die 218(1), and channel 222(1) of core die 218(0).

Relative to the Y-axis shown in FIG. 2B, array 230(1) is between array 226(1) and array 230(2). Similarly, array 230(2) is between array 226(2) and array 230(1).

In some embodiments, TSVs 228 of array 226(1) provide power system (PS) voltages to even-numbered channels 222(0), 222(2), 222(4) and 222(6), and TSVs 228 of array 226(2) carry PS voltages to odd-numbered channels 222(1), 222(3), 222(5) and 222(7).

In some embodiments, TSVs 232 of array 230(1) carry input/output (I/O) signals and/or control signals to even-numbered channels 222(0), 222(2), 222(4) and 222(6), and TSVs 230 of array 232(2) carry I/O signals and/or control signals to odd-numbered channels 222(1), 222(3), 222(5) and 222(7).

In FIG. 2B, memory cells MC in each of banks B0-B7 are arranged into arrays. Each memory cell MC is a dynamic random access memory (DRAM) cell. In some embodiments, memory cells MC are a type of memory cell other than a DRAM cell.

As shown in an exploded view 223 included in FIG. 2B, each memory cell MC includes a capacitor C1 and a first field-effect transistor (FET) FET1. Capacitor C1 is used to store data voltages, e.g., bit values. That is, capacitor C1 stores a voltage representing a logical zero, i.e., a 0 bit, or a voltage representing a logical one, i.e., a 1 bit. Transistor FET1 is a switch used to transmit data voltages to capacitor C1. In exploded view 223, DRAM cell MC is assumed to be in the i-th row and the j-th column of the array. Accordingly, switch FET1 electrically coupled between i-th bitline B(i) and a first terminal of capacitor C1, and a second terminal of capacitor C1 is electrically coupled to a low system voltage, e.g., ground, as contrasted with a high system voltage, VDD. In some embodiments, ground is VSS. The gate electrode of switch FET1 is electrically coupled to a j-th row-enable line RE(j). Capacitor C1 is electrically coupled to bitline BL(i) when switch FET1 is turned on by the signal on row-enable line RE(j).

Figure 2C:
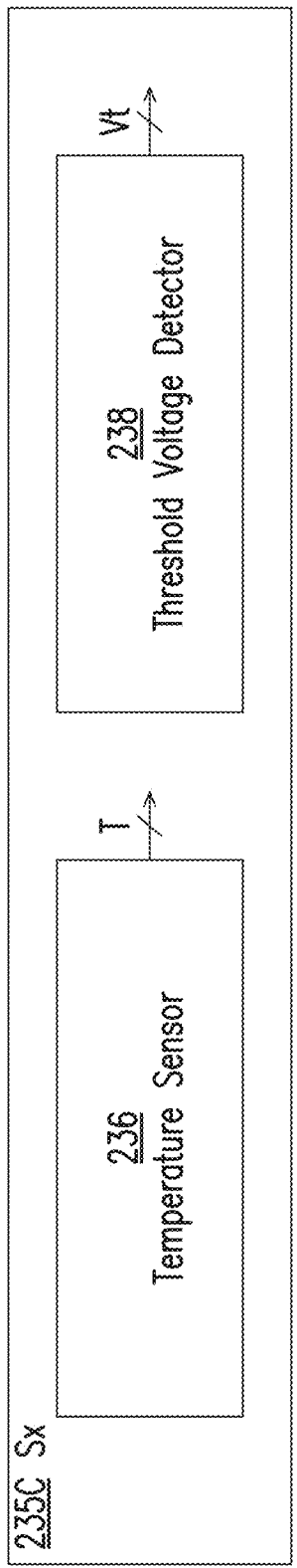
FIGS. 2C-2E are corresponding block diagrams of corresponding sensing units, in accordance with some embodiments.
Figure 2D:
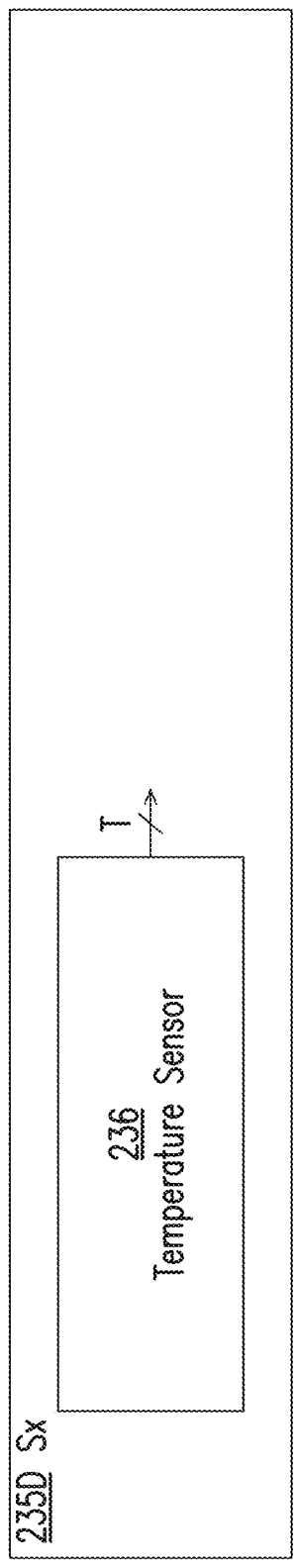

In FIG. 2B, each of banks B0-B7 includes corresponding sensing units S0-S7 (sec FIGS. 2C-2D). For example, bank B0 of group 224(0) of channel 222(6) of core die 218(3) includes sensing unit S0. Physically/spatially, sensing units S0-S7 are located proximally to corresponding banks B0-B7. Each of sensing units S0-S7 generates environmental information, e.g., temperature and/or threshold voltage, or the like. Because of the proximity of sensing units S0-S7 to corresponding banks B0-B7, the environmental information generated by sensing units S0-S7 is regarded as being representative of all of memory cells MC in corresponding banks B0-B7. For example, because of the proximity of sensing unit S2 of bank B2 of group 224(0) of channel 226(6) of core die 218(3) to bank B2 of group 224(0) of channel 226(6) of core die 218(3), the environmental information generated by sensing unit S2 of bank B2 of group 224(0) of channel 226(6) of core die 218(3) is regarded as being representative of all of memory cells MC in bank B2 of group 224(0) of channel 226(6) of core die 218(3).

As shown in FIG. 2B: relative to the Y-axis, sensing units S0-S7 are centrally located in corresponding banks B0-B7; and, relative X-axis, sensing units S0-S7 are located at the right side of corresponding banks B0-B7. In some embodiments, relative to the X-axis and the Y-axis, sensing units S0-S7 are centrally located in corresponding banks B0-B7. In some embodiments, relative to the X-axis and the Y-axis, sensing units S0-S7 are located positions other than as noted above.

For simplicity of illustration, not all of the components of HBM 204 are shown in FIG. 2B. Also, for simplicity of illustration, not all components shown in HMB 204 are labelled in FIG. 2B. For example, in FIG. 2B, HBM 204 further includes one or more DDVFS devices (see FIGS. 3A-3D). In some embodiments, each of core dies 218(0)-218(3) includes one or more DDVFS devices. In some embodiments, one or more DDVFS devices are located in a buffer die 212.

In some embodiments, HBM 204 is compliant with a standard JESD-235 as defined by the standards-setting organization known as the Joint Electron Device Engineering Council (JEDEC). In some embodiments, HBM 204 is compliant with a standard JESD-235A as defined by the JEDEC. In some embodiments, HBM 204 is compliant with a standard for HMBs defined by another standards-setting organization. Details of typical HBMs, albeit HMBs which do not include, e.g., sensors S0-S7 and DDVFS devices such as disclosed herein, are found, e.g., in U.S. Pat. No. 10,180,906, granted Jan. 15, 2019, and U.S. Pre-Grant Publication No. 202100247978, published Aug. 12, 2021, the entireties of each of which are hereby incorporated by reference.

Figure 2E:
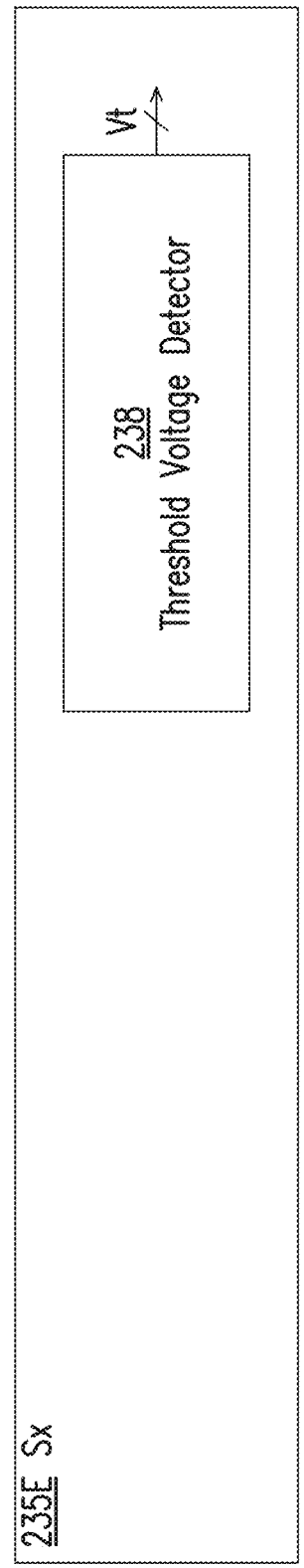

FIGS. 2C-2E a corresponding block diagrams of corresponding sensing units, in accordance with some embodiments.

Sensing unit 235C of FIG. 2C is an example of each of sensing units S0-S7 of FIG. 2B. Accordingly, sensing unit 235C is also labeled "Sx" in FIG. 2C.

In FIG. 2C, sensing unit 235C includes a temperature sensor 236 and a threshold voltage sensor 238. Temperature sensor 236 (see FIGS. 5A-5B) is configured to sense a temperature and output a signal T which is representative of the sensed temperature. Because of the proximity of temperature sensor 236 to a first given instance of memory cell MC of a given bank, signal T is regarded as being representative of the temperature of all instances of memory cell MC in the given bank. The temperature signal T is an example of an environmental signal. Threshold voltage detector 238 (see FIGS. 6A-6C) is configured to detect a threshold voltage and output a signal Vt which is representative of the sensed threshold voltage. Because of the proximity of threshold voltage sensor 238 to a given instance of transistor FET1 in a second given instance of memory cell MC of a given bank, signal Vt is regarded as being representative of the threshold voltage of all instances of transistor FET1 in all instances of memory cell MC in the given bank. The threshold voltage Vt is an example of an environmental signal. In some embodiments, the first given instance of memory cell MC in the given bank is the same as the second given instance of memory cell MC in the given bank.

In some embodiments, sensing unit 235C of FIG. 2C includes temperature sensor 236 but does not include threshold voltage sensor 238. Such embodiments are shown in FIG. 2D as sensing unit 235D.

In some embodiments, sensing unit 235C of FIG. 2C includes threshold voltage sensor 238 but does not include temperature sensor 236. Such embodiments are shown in FIG. 2E as sensing unit 235E.

FIGS. 3A-3D are block diagrams of corresponding HBMs, in accordance with some embodiments.

Each of HBMs 304A, 304B, 304C and 304D of corresponding FIGS. 3A-3D is an example of HBM 204 of FIG. 2B.

In some respects, FIGS. 3A-3D are simplified representations of corresponding HBMs 304A-304D as compared to HBM 204 of FIG. 2B. But in some respects, FIGS. 3A-3D are more detailed representations of corresponding HBMs 304A-304D as compared to HBM 204 of FIG. 2B.

Figure 3A:
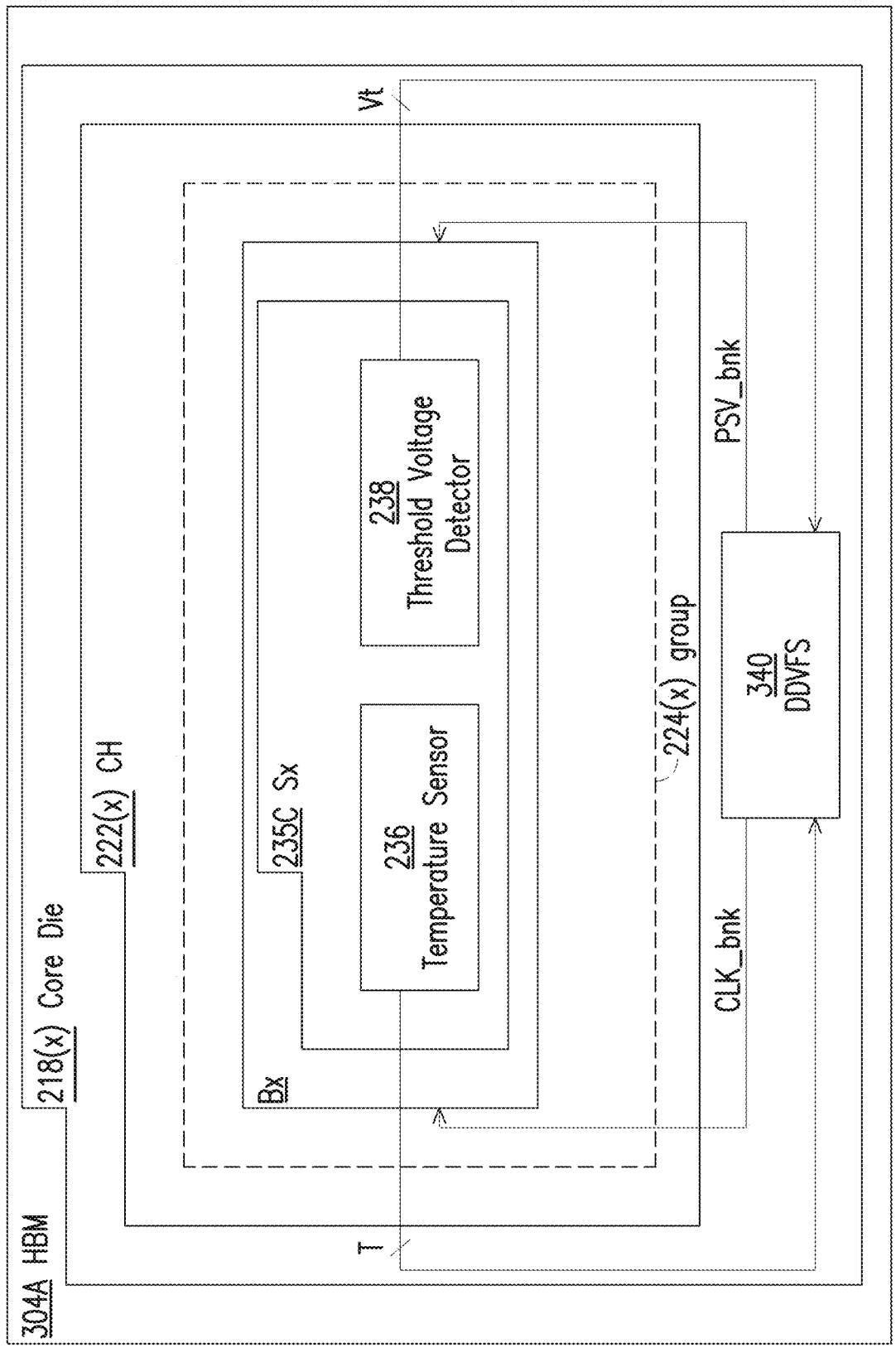
FIGS. 3A-3D are block diagrams of corresponding HBMs, in accordance with some embodiments.
Figure 3B:
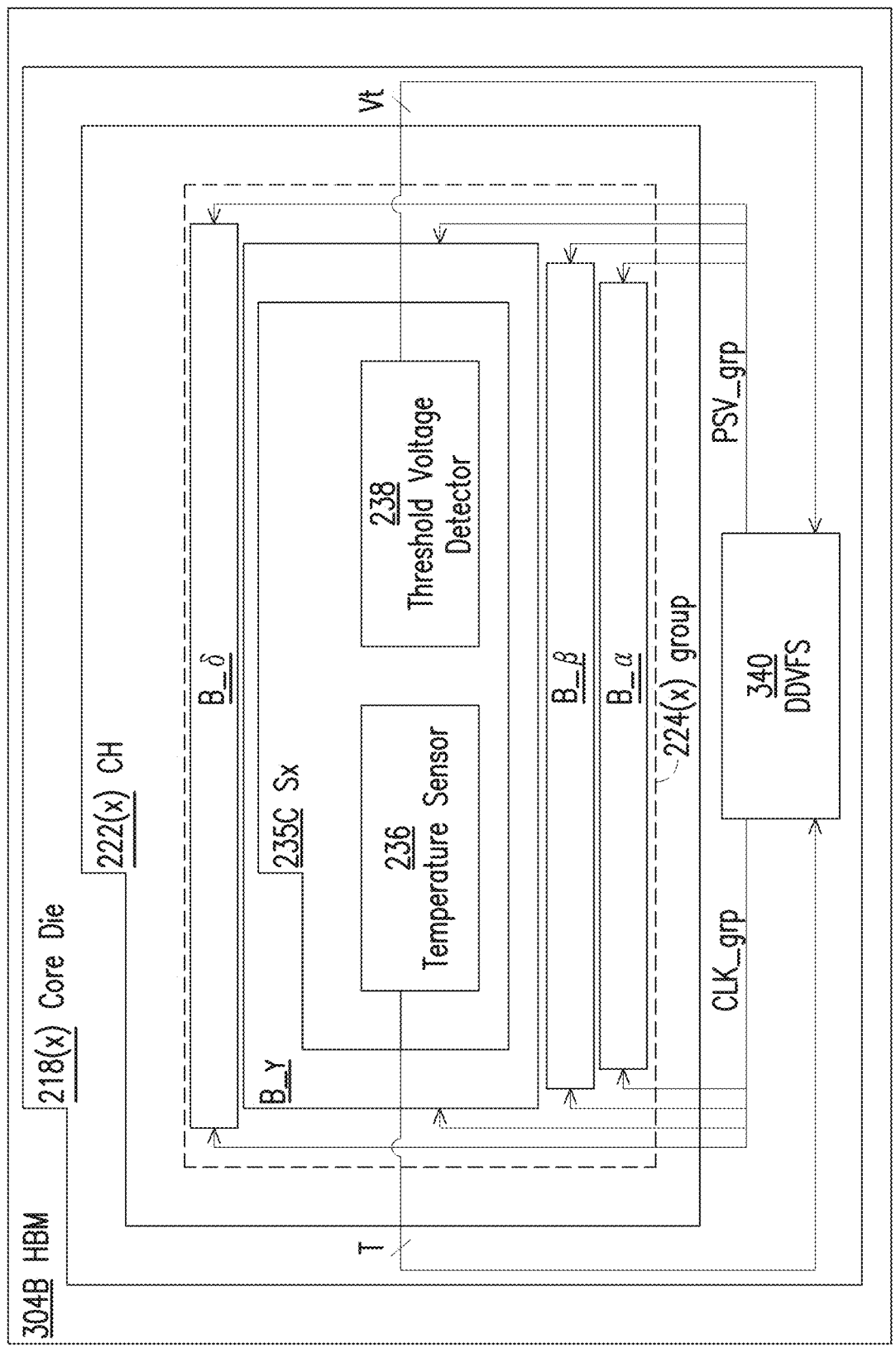
Figure 3C:
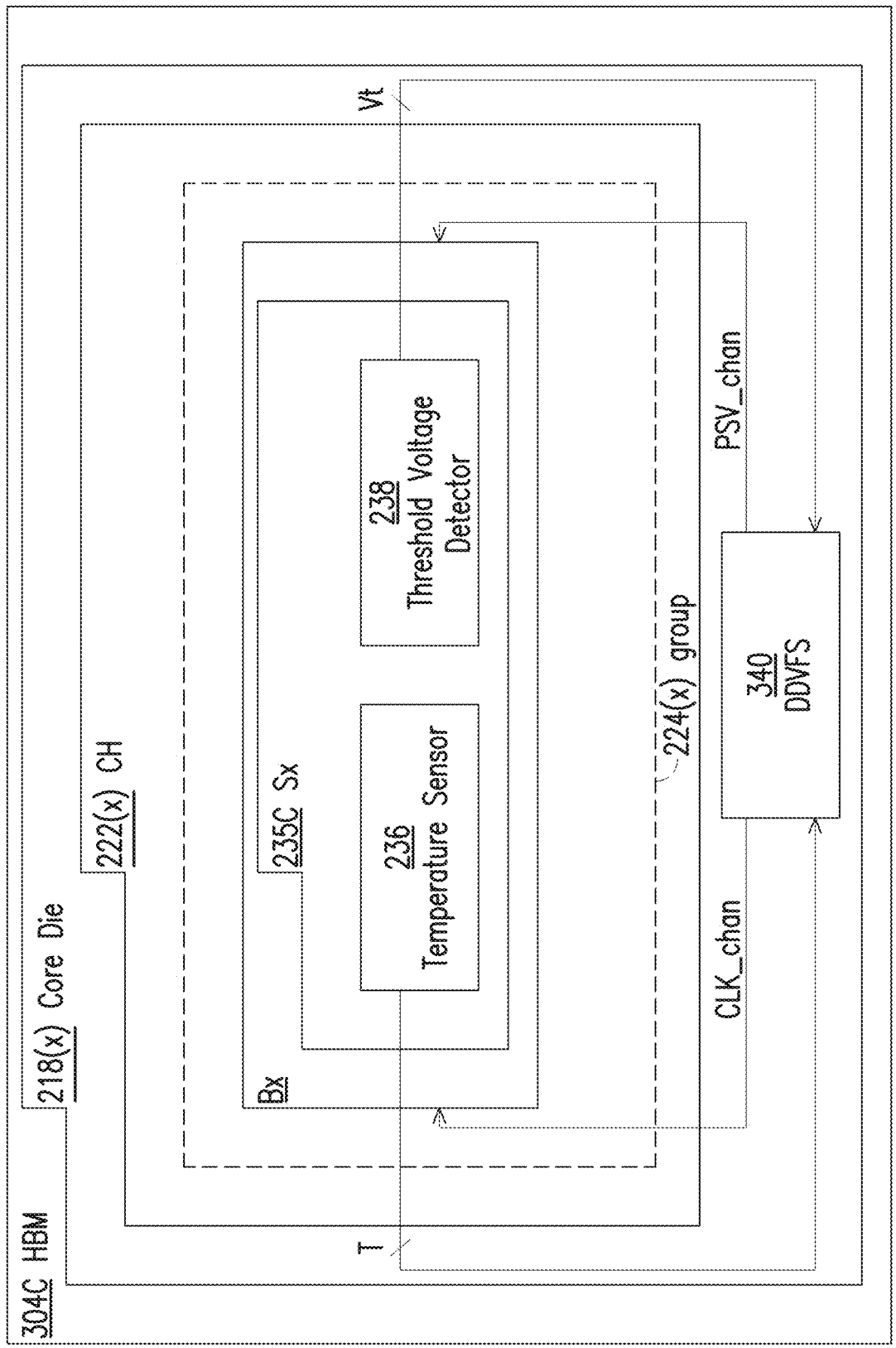
Figure 3D:
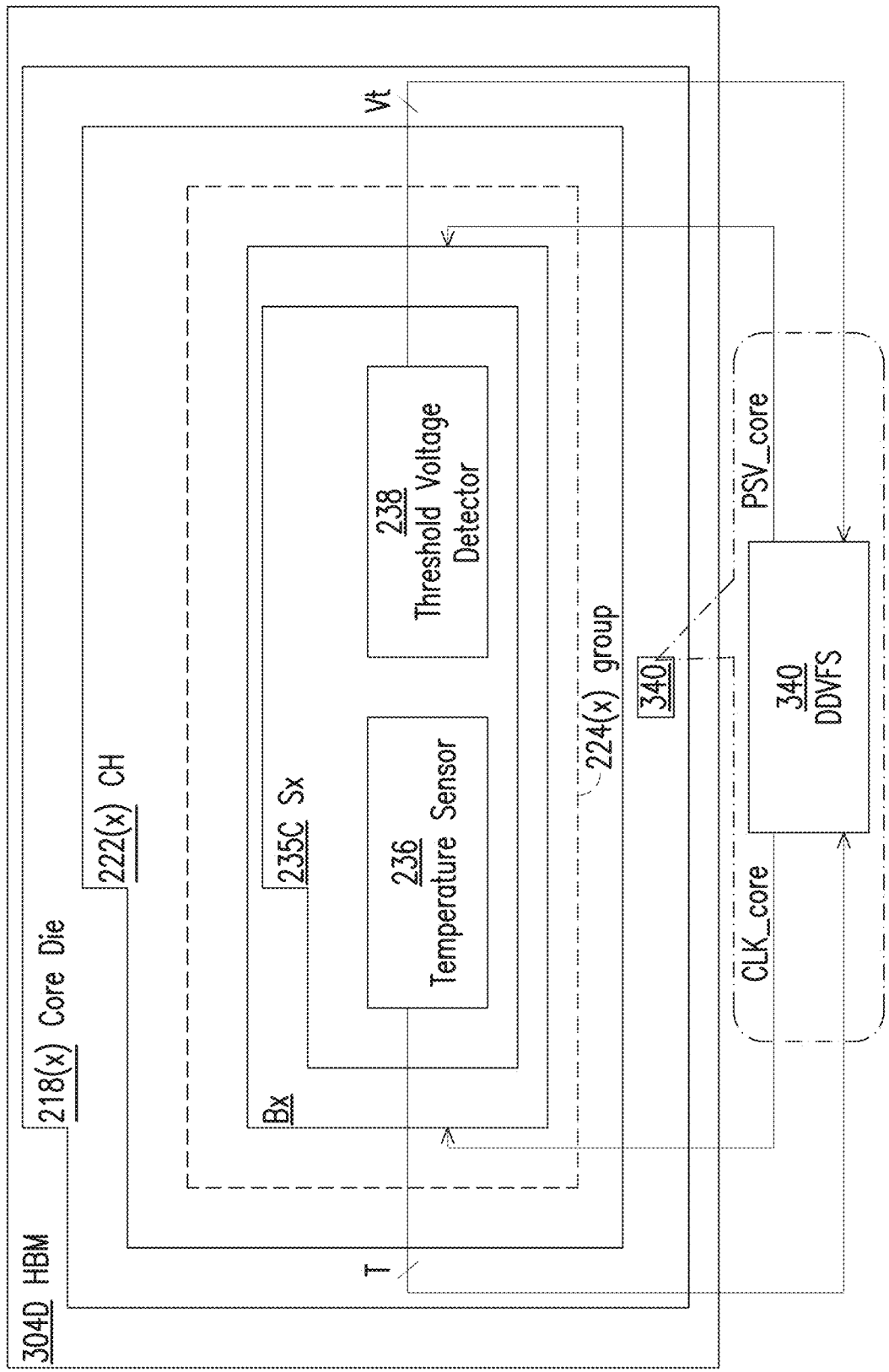

In FIGS. 3A and 3C-3D, each of corresponding HBMs 304A, 304C and 304D includes: a core die 218($x$); a channel 222($x$); a bank Bx; and a sensing unit 235C. Core die 218($x$) is an example of each of core dies 218(0)-218(3) of FIG. 2B. Channel 228($x$) is an example of each of channels 222(0)-222(7) of FIG. 2B. Bank Bx is an example of each of banks B0-B7 of FIG. 2B. In FIG. 3B, HBM 304B includes banks B_$\alpha$, B_$\beta$, B_$\gamma$ and B_$\delta$. Where banks B_$\alpha$, B_$\beta$, B_$\gamma$ and B_$\delta$ are included in left-side groups 224($x$), banks B_$\alpha$, B_$\beta$, B_$\gamma$ and B_$\delta$ correspond to banks B4-B7. Where banks B_$\alpha$, B_$\beta$, B_$\gamma$ and B_$\delta$ are included in right-side groups 224($x$), banks B_$\alpha$, B_$\beta$, B_$\gamma$ and B_$\delta$ correspond to banks B0-B3.

In FIGS. 3A-3D, each of corresponding HBMs 304A, 304B, 304C and 304D further includes a differentiated dynamic voltage and frequency scaling (DDVFS) device 340 (sec FIGS. 4A-4G). In each of FIGS. 3A-3D, DDVFS device 340 is included in core die 218($x$). In some embodiments, core die 218($x$) includes multiple instances of DDVFS device 340.

In some embodiments, one or more instances of DDVFS device 340 are in a buffer die (FIG. 2B) rather than in corresponding instances of core die 218($x$). In some embodiments, one or more instances of DDVFS device 340 are in a buffer die (FIG. 2B) in addition to one or more instances of DDVFS device 340 in corresponding instances of core die 218($x$). In some embodiments, one or more instances of DDVFS device 340 are in processor 202 (FIG. 2A) rather than in corresponding instances of core die 218($x$). In some embodiments, one or more instances of DDVFS device 340 are in processor 202 (FIG. 2A) in addition to one or more instances of DDVFS device 340 in corresponding instances of core die 218(*x*). In some embodiments, one or more instances of DDVFS device 340 are locations other than the locations noted above.

In FIGS. 3A-3D, each of corresponding HBMs 304A-304D is arranged so that DDVFS device 340 receives: temperature T from temperature sensor 236 (see FIGS. 5A-5B) of sensing unit 235C; and threshold voltage Vt from threshold voltage detector 238 of sensing unit 235C. Because of the proximity of temperature sensor 236 to a first given instance of memory cell MC of bank Bx, signal T is regarded as being representative of the temperature of all instances of memory cell MC in bank Bx. Because of the proximity of temperature sensor 236 to a given instance of transistor FET1 in a second given instance of memory cell MC of bank Bx, signal Vt is regarded as being representative of the threshold voltage of all instances of transistor FET1 in all instances of memory cell MC in bank Bx. In some embodiments, the first given instance of memory cell MC in bank Bx is the same as the second given instance of memory cell MC in bank Bx.

In each of FIGS. 3A-3D, DDVFS device 340 is configured to adjust: a local clock signal (see FIGS. 4A-4G) based on temperature T and/or a threshold voltage Vt; and/or adjust a local power supply (PS) voltage (see FIGS. 4A-4G) based on temperature T and/or threshold voltage Vt. Each of the local clock signal and the local PS voltage is an example of a transistor-temperature-affecting (TTA) parameter. By adjusting the local clock signal and/or the local PS voltage, DDVFS device adaptively adjusts/controls temperatures of corresponding instances of memory cell MC (see FIG. 2B).

In general, to reduce temperature, DDVFS device 340 decreases a frequency of the local clock signal and/or decreases a value of the local PS voltage. In general, a reduction in the frequency of the local clock signal and/or in value of the local PS voltage tends also to reduce the performance of instances of memory cell MC which receive the local clock signal and/or the local PS voltage. Conversely, where current temperature is below a maximum permissible temperature such that circumstances would permit a safe rise in temperature of instances of memory cell MC which receive the local clock signal and/or the local PS voltage, in general, performance of the of instances of memory cell MC which receive the local clock signal and/or the local PS voltage is improved by DDVFS 340 increasing a frequency of the local clock signal and/or increasing a value of the local PS voltage. The DVFS technique according to the other approach, which uses monolithic thermal throttling to provide the same clock signal to all the bit cells of all the core dies, treats the HMB according to the other approach as a monolith, i.e., does not treat the HBM of the other approach as including different portions which behave differently, increases a frequency the clock signal only when the temperature of all portions of all core dies in the HBM can be raised safely. Often, however, the portion of a given core die which exceeds the permissible temperature is a minority portion of the given core die. As a result, while the monolithic thermal throttling according to the other approach cools the minority portion of the given core die, the monolithic thermal throttling according to the other approach also unnecessarily prevents a majority portion of the given core die and the entireties of the other core dies from undergoing a safe increase in temperature associated with an increase in the frequency the clock signal and the value of the PS voltage signal, resulting in unnecessarily diminished performance of the majority portion of the given core die and the entireties of the other core dies, which is wasteful and inefficient. In contrast to the monolithic thermal throttling of the other approach, in terms of portions of the HBM which are to be cooled, the differentiated thermal throttling of each of HBM 304A (bank-wide, discussed below), HBM 304B (group-wide, discussed below), HBM 304C (channel-wide, discussed below) and HBM 304D (core-wide, discussed below) is more granular, and thus is less wasteful and more efficient.

As discussed in more detail below, FIGS. 3A-3D differ from each other, for example, in terms of which components of corresponding HBMs 304A-304D are configured to receive the local clock signal and/or the local voltage from DDVFS device 340, and in terms of how many instances of sensing unit 235C transmit temperature T and/or threshold voltage Vt to DDVFS device 340.

Turning specifically to FIG. 3A, HBM 304A is configured so that each instance of bank Bx receives the local clock signal and the local supply voltage from a corresponding instance of DDVFS device 340. Accordingly, HBM 304A is configured so that each instance of sensing unit 235C, i.e., each bank Bx, transmits temperature T and threshold voltage Vt to DDVFS device 340. Because each instance of bank Bx receives the local clock signal and the local supply voltage from DDVFS device 340 in FIG. 3A, the local clock signal is labeled CLK_bnk and the local PS voltage is labeled PSV_bnk in FIG. 3A. Each of the signals CLK_bnk and PSV_bnk is an example of a TTA parameter.

The context for the adjective "local" in FIG. 3A is bank-specific, otherwise described as bank-by-bank. Accordingly, the arrangement of HBM 304A results in bank-wide adjustment of corresponding temperatures amongst memory cells (not shown) in each instance of bank Bx, i.e., the arrangement of HBM 304A results in a bank-wide type of differentiated thermal throttling. Such bank-wide differentiated thermal throttling contrasts with the monolithic thermal throttling of the other approach. The DVFS technique according to the other approach uses monolithic thermal throttling, i.e., provides the same clock signal to all of the bit cells of all the core dies thereby treating the HMB according to the other approach as a monolith, i.e., not treating the HBM according to the other approach as including different portions which behave differently. Often, however, the portion of a given core die which exceeds the permissible temperature is a minority portion of the given core die. As a result, the monolithic thermal throttling according to the other approach not only cools the minority portion of the given core die, but also unnecessarily cools the majority portion of the given core die and the entireties of the other core dies, resulting in unnecessarily diminished performance of the majority portion of the given core die and the entireties of the other core dies, which is wasteful and inefficient. In contrast to the monolithic thermal throttling of the other approach, in terms of portions of the HBM whose temperatures are to be controlled, e.g. cooled, the bank-wide differentiated thermal throttling of HBM 304A is more granular, and thus is less wasteful and more efficient.

Turning specifically to FIG. 3B, HBM 304B is configured so that each instance of group 224(*x*) receives the local clock signal and the local supply voltage from a corresponding instance of DDVFS device 340. As such, each of banks B_α, B_β, B_γ and B_δ in group 224(*x*) receives the same local clock signal and the same local supply voltage from DDVFS device 340. Accordingly, HBM 304B is configured so that sensing unit 235C of one of banks B_α, B_β, B_γ and B_δ transmits temperature T and threshold voltage Vt to DDVFS device 340. In FIG. 3B, bank B_γ is shown as transmitting temperature T and threshold voltage Vt to DDVFS device 340. In some embodiments (not shown), one of banks B_α, B_β and B_δ transmits temperature T and threshold voltage Vt to DDVFS device 340 rather than bank B_γ. Because each instance of group 224(x) receives the local clock signal and the local supply voltage from DDVFS device 340 in FIG. 3B, i.e., because each of banks B_α, B_β, B_γ and B_δ in group 224(x) receives the same local clock signal and the same local supply voltage from DDVFS device 340 in FIG. 3B, the local clock signal is labeled CLK_grp and the local PS voltage is labeled PSV_grp in FIG. 3B. Each of the signals CLK_grp and PSV_grp is an example of a TTA parameter.

The context for the adjective "local" in FIG. 3B is group-specific, otherwise described as group-by-group. Accordingly, the arrangement of HBM 304B results in group-wide adjustment of corresponding temperatures amongst memory cells (not shown) in each instance of group 224(x), i.e., the arrangement of HBM 304B results in a group-wide type of differentiated thermal throttling. Such group-wide differentiated thermal throttling contrasts with the monolithic thermal throttling of the other approach. In contrast to the monolithic thermal throttling of the other approach, in terms of portions of the HBM which are to be cooled, the group-wide differentiated thermal throttling of HBM 304B is more granular, and thus is less wasteful and more efficient.

Regarding FIG. 3B, because HBM 304B is configured so that sensing unit 235C of one of banks B_α, B_β, B_γ and B_δ transmits temperature T and threshold voltage Vt to DDVFS device 340, in some embodiments (not shown), at least one but not all of banks B_α, B_β, B_γ and B_δ in a given instance of group 224(x) includes a corresponding sensing unit 245C.

Turning specifically to FIG. 3C, HBM 304C is configured so that each instance of channel 222(x) receives the local clock signal and the local supply voltage from a corresponding instance of DDVFS device 340. As such, each instance of group 224(x) in channel 222(x), and thus each corresponding instance of bank Bx in channel 222(x), receives the same local clock signal and the same local supply voltage from DDVFS device 340. Accordingly, HBM 304C is configured so that sensing unit 235C of one of banks Bx in one of groups 224(x) transmits temperature T and threshold voltage Vt to DDVFS device 340. Because each instance of channel 222(x) receives the local clock signal and the local supply voltage from DDVFS device 340 in FIG. 3C, the local clock signal is labeled CLK_chan and the local PS voltage is labeled PSV_chan in FIG. 3C. Each of the signals CLK_chan and PSV_chan is an example of a TTA parameter.

The context for the adjective "local" in FIG. 3C is channel-specific, otherwise described as channel-by-channel. Accordingly, the arrangement of HBM 304C results in channel-wide adjustment of corresponding temperatures amongst memory cells (not shown) in each instance of channel 222(x), i.e., the arrangement of HBM 304C results in a channel-wide type of differentiated thermal throttling. Such channel-wide differentiated thermal throttling contrasts with the monolithic thermal throttling of the other approach. In contrast to the monolithic thermal throttling of the other approach, in terms of portions of the HBM which are to be cooled, the channel-wide differentiated thermal throttling of HBM 304C is more granular, and thus is less wasteful and more efficient.

Regarding FIG. 3C, because HBM 304C is configured so that sensing unit 235C of one of banks Bx in one of groups 224(x) transmits temperature T and threshold voltage Vt to DDVFS device 340, in some embodiments (not shown), not every instance of group 224(x) in a given instance of channel 222(x), and thus not every instance of bank Bx in the given instance of channel 222(x), includes a corresponding sensing unit 245C.

Turning specifically to FIG. 3D, HBM 304D is configured so that each instance of core-die 218(x) receives the local clock signal and the local supply voltage from a corresponding instance of DDVFS device 340. As such, each instance of channel 222(x) in core die 218(x), and thus each corresponding instance of group 224(x) in core die 218(x), and thus each corresponding instance of bank Bx in core die 218(x), receives the same local clock signal and the same local supply voltage from DDVFS device 340. Accordingly, HBM 304D is configured so that sensing unit 235C of one of banks Bx in one of groups 224(x) in one channels 222(x) in one of core dies 218(x) transmits temperature T and threshold voltage Vt to DDVFS device 340. Because each instance of core die 218(x) receives the local clock signal and the local supply voltage from DDVFS device 340 in FIG. 3D, the local clock signal is labeled CLK_core and the local PS voltage is labeled PSV_core in FIG. 3D. Each of the signals CLK_core and PSV_core is an example of a TTA parameter.

The context for the adjective "local" in FIG. 3D is core-specific, otherwise described as core-by-core. Accordingly, the arrangement of HBM 304D results in core-wide adjustment of corresponding temperatures amongst memory cells (not shown) in each instance of core die 218(x), i.e., the arrangement of HBM 304D results in a core-wide type of differentiated thermal throttling. Such core-wide differentiated thermal throttling contrasts with the monolithic thermal throttling of the other approach. In contrast to the monolithic thermal throttling of the other approach, in terms of portions of the HBM which are to be cooled, the core-wide differentiated thermal throttling of HBM 304D is more granular, and thus is less wasteful and more efficient.

Regarding FIG. 3D, because HBM 304D is configured so that sensing unit 235C of one of banks Bx in one of groups 224(x) in one channels 222(x) in one of core dies 218(x) transmits temperature T and threshold voltage Vt to DDVFS device 340, in some embodiments (not shown), not every instance of channel 222(x) in a given instance of core die 218(x), and thus not every instance of group 224(x) in the given instance of channel 222(x), and thus not every instance of bank Bx in the given instance of channel 222(x), includes a corresponding sensing unit 245C.

Regarding FIGS. 3A-3B, in some embodiments (not shown), each of corresponding HBMs 304A-304D includes sensing unit 235D of FIG. 2D rather than sensing unit 235C of FIG. 2C. It is to be recalled that sensing unit 235D includes temperature sensor 236 but does not include threshold voltage sensor 238. Accordingly, in such embodiments, each of corresponding HBMs 304A-304D (sec FIGS. 4B, 4C and 4F) is arranged so that DDVFS device 340 receives only temperature T from temperature sensor 236.

Regarding FIGS. 3A-3B, in some embodiments (not shown), each of corresponding HBMs 304A-304D includes sensing unit 235E of FIG. 2E rather than sensing unit 235C of FIG. 2C. It is to be recalled that sensing unit 235E includes threshold voltage sensor 238 but does not include temperature sensor 236. Accordingly, in such embodiments, each of corresponding HBMs 304A-304D (sec FIGS. 4D, 4E and 4G) is arranged so that DDVFS device 340 receives only threshold voltage Vt from temperature sensor 236.

FIGS. 4A-4G are block diagrams of corresponding DDVFS devices 442A-442G, in accordance with some embodiments.

In FIGS. 4A-4G, each of corresponding DDVFS devices 442A-442G is an example of DDVFS device 340 of FIGS. 3A-3D.

Figure 4A:
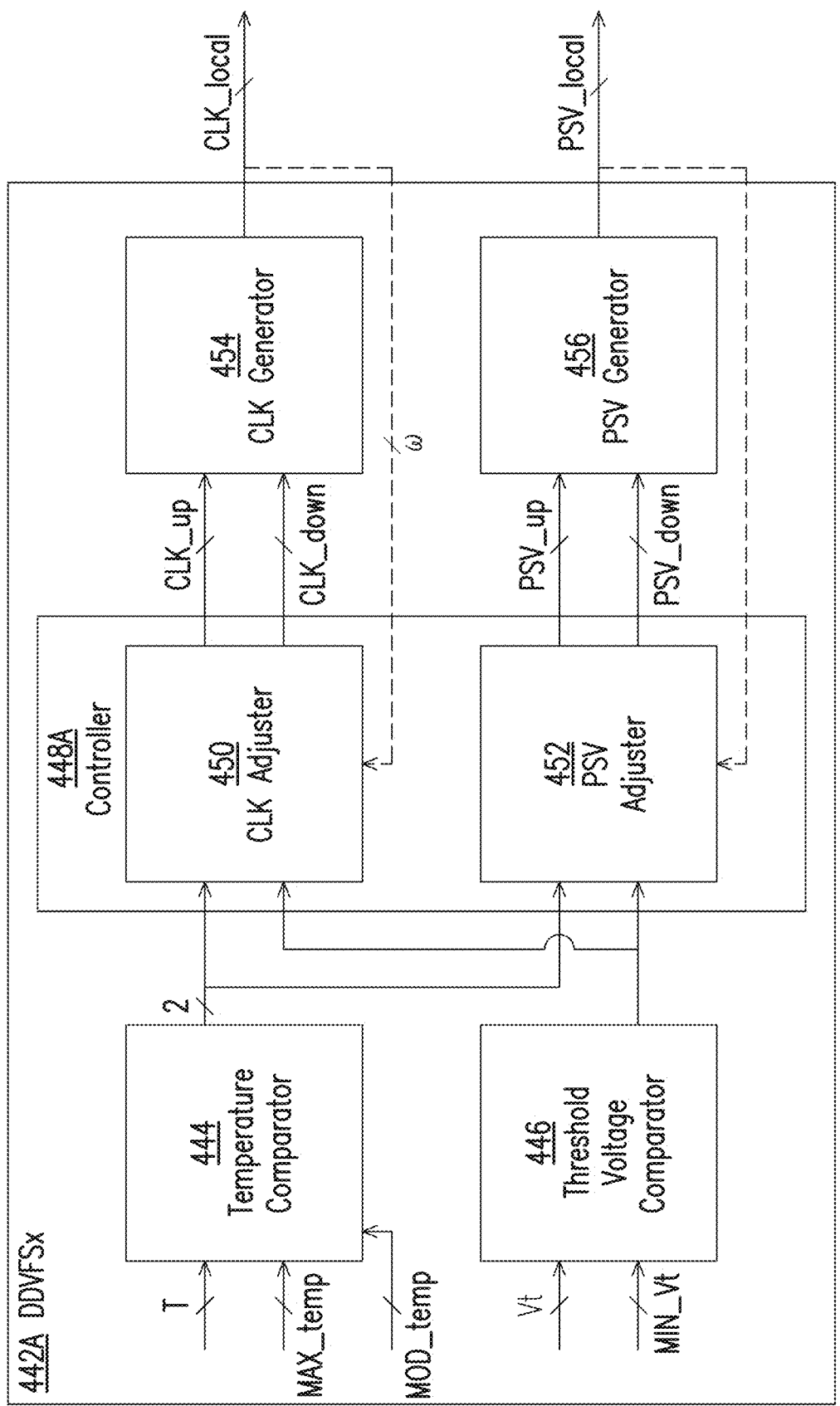
FIGS. 4A-4G are block diagrams of corresponding DDVFS devices, in accordance with some embodiments.

In FIG. 4A, DDVFS device 442A includes: a temperature comparator 444; a threshold voltage comparator 446; a controller 448A; a clock generator 454; and a PS voltage (PSV) generator 456. Controller 448A includes a clock adjuster 450 and a PS voltage adjuster 452.

Temperature comparator 444 is configured to receive temperature T from temperature sensor 236 of sensing unit 235C of FIGS. 3A-3D, and a signal MAX_temp representing a maximum permissible temperature for any instance of memory cell MC of HBMs 304A-304D of corresponding FIGS. 3A-3D. Temperature comparator 444 is further configured: to make a first comparison by comparing temperature T against temperature-reference MAX_temp; and to generate a first output signal representing the first temperature-comparison results, where the first output signal indicates which of temperature T and temperature-reference MAX_temp is larger.

Temperature comparator 444 is further configured to receive a signal MOD_temp representing a moderate temperature for any instance of memory cell MC of HBMs 304A-304D of corresponding FIGS. 3A-3D. In a circumstance in which temperature T is less than MAX_temp, such that a rise in temperature T could be safely accommodated by instances of memory cell MC in FIGS. 3A-3D which receive the corresponding local clock signal and/or the local PS voltage, in general, performance of the of instances of memory cell MC which receive the corresponding local clock signal and/or the local PS voltage is improved by DDVFS 340 increasing a frequency of the corresponding local clock signal and/or increasing a value of the corresponding local PS voltage. Accordingly, temperature comparator 444 is further configured: to make a second comparison by comparing temperature T against temperature-reference MOD_temp; and to generate a second output signal representing the second temperature-comparison results, where the second output signal indicates which of temperature T and temperature-reference MOD_temp is larger.

Threshold voltage comparator 446 is configured to receive threshold voltage Vt from threshold voltage detector 238 of sensing unit 235C of FIGS. 3A-3D, and a signal MIN_Vt representing a minimum permissible threshold voltage for any instance of transistor FET1, and thus any instance of memory cell MC, of HBMs 304A-304D of corresponding FIGS. 3A-3D.

Threshold voltage comparator 446 is further configured: to make a comparison by comparing threshold voltage Vt against voltage-reference MIN_Vt; and to generate an output signal representing the voltage-comparison results, where the output signal indicates which of threshold voltage Vt and voltage-reference MIN_Vt is larger.

In FIG. 4A, controller 448A is configured to receive the first and second temperature-comparison results from temperature comparator 444 and the voltage-comparison results from threshold voltage comparator 446. More particularly, each of clock adjuster 450 and PS voltage adjuster 452 of controller 448A is configured to receive the first and second temperature-comparison results from temperature comparator 444 and the voltage-comparison results from threshold voltage comparator 446.

Clock adjuster 450, and thus controller 448A, is configured to cause the frequency of a local clock signal CLK_local to be increased or decreased by CLK generator 454 based on the first and second temperature-comparison results from temperature comparator 444 and/or the voltage-comparison results from threshold voltage comparator 446.

Local clock signal CLK_local is an example of CLK_bnk of FIG. 3A, CLK_grp of FIG. 3B, CLK_chan of FIG. 3C, or CLK_core of FIG. 3D, or the like. More particularly, Clock adjuster 450 is configured to generate control signals CLK_up and CLK_down and thereby control CLK generator 454 correspondingly to increase or decrease the frequency of local clock signal CLK_local.

Signals CLK_up and CKL_down have mutually exclusive states. In some embodiments, when control signal CLK_up is in a high-state (which indicates that the frequency of local clock signal CLK_local is to be increased), then control signal CLK_down is in a low-state (which indicates that the frequency of local clock signal CLK_local is not to be decreased). Conversely, when control signal CLK_up is in the low-state (which indicates that the frequency of local clock signal CLK_local is not to be increased), then control signal CLK_down is in the high-state (which indicates that the frequency of local clock signal CLK_local is to be decreased). In some embodiments (not shown), clock adjuster 450 outputs a single control signal to CLK generator 454 rather than control signals CLK_up and CLK_down. In such embodiments, the single control signal has states which correspondingly indicate whether the frequency of the local clock signal CLK_local is to be increased or decreased.

In some embodiments, when the first temperature-comparison results indicate that temperature T is above MAX_temp, then clock adjuster 450 outputs control signal CLK_up in the low-state and control signal CLK_down in the high-state. Such a combination of states of control signals CLK_up and CLK_down, causes CLK generator 454 to alter, i.e., to decrease, the frequency of the local clock signal CLK_local.

In some embodiments, when the first voltage-comparison results indicate that threshold voltage is below MIN_Vt, then clock adjuster 450 outputs control signal CLK_up in the low-state and control signal CLK_down in the high-state. Such a combination of states of control signals CLK_up and CLK_down, causes CLK generator 454 to alter, i.e., to decrease, the value of the local PS voltage PSV_local.

In some embodiments, when the first temperature-comparison results indicate that temperature T is below MAX_temp and the second temperature-comparison results indicate that temperature T is below MOD_temp, then clock adjuster 450 outputs control signal CLK_up in the high-state and control signal CLK_down in the low-state. Such a combination of states of control signals CLK_up and CLK_down, causes CLK generator 454 to alter, i.e., to increase, the frequency of the local clock signal CLK_local up to a permissible maximum value.

PS voltage adjuster 452, and thus controller 448A, is configured to cause the value of a local PS voltage PSV_local to be increased or decreased by PSV generator 456 based on the first and second temperature-comparison results from temperature comparator 444 and/or the voltage-comparison results from threshold voltage comparator 446. Local PS voltage PSV_local is an example of PSV_bnk of FIG. 3A, PSV_grp of FIG. 3B, PSV_chan of FIG. 3C, or PSV_core of FIG. 3D, or the like. More particularly, PS voltage adjuster 452 is configured to generate control signals PSV_up and PSV_down and thereby control PSV generator 456 correspondingly to increase or decrease the value of local PS voltage PSV_local.

Signals PSV_up and PSV_down have mutually exclusive states. In some embodiments, when signal PSV_up is in a high-state (which indicates that the value of local PS voltage PSV_local is to be increased), then signal PSV_down is in a low-state (which indicates that the value of local PS voltage PSV_local is not to be decreased). Conversely, when signal PSV_down is in the high-state (which indicates that the value of local PS voltage PSV_local is to be decreased), then signal PSV_up is in the low-state (which indicates that the value of local PS voltage PSV_local is not to be increased). In some embodiments (not shown) PS voltage adjuster 452 outputs a single control signal to PSV generator 456 rather than control signals PSV_up and PSV_down. In such embodiments, the single control signal has states which correspondingly indicate whether the value of the local PS voltage PSV_local is to be increased or decreased.

In some embodiments, when the first voltage-comparison results indicate that threshold voltage Vt is below MIN_Vt, then PSV adjuster 452 outputs control signal PSV_up in the low-state and control signal PSV_down in the high-state. Such a combination of states of control signals PSV_up and PSV_down, causes PSV generator 456 to alter, i.e., to decrease, the value of the local PS voltage PSV_local.

In some embodiments, when the first temperature-comparison results indicate that temperature T is above MAX_temp, then PSV adjuster 452 outputs control signal PSV_up in the low-state and control signal PSV_down in the high-state. Such a combination of states of control signals PSV_up and PSV_down, causes PSV generator 456 to alter, i.e., to decrease, the value of the local PS voltage PSV_local.

Optionally, in some embodiments, DDVFS 442A is configured with a feedback loop (shown as a phantom line, i.e., a dashed line) which feeds the frequency, @, of local clock signal CLK_local back to clock adjuster 450. In such embodiments, clock adjuster 450, and thus controller 448A, is configured to cause the frequency of a local clock signal CLK_local to be increased or decreased by CLK generator 454 based in part on (A) the feedback value of local clock signal CLK_local and (B) the first and second temperature-comparison results from temperature comparator 444 and/or the voltage-comparison result from threshold voltage comparator 446.

Optionally, in some embodiments, DDVFS 442A is configured with a feedback loop (shown as a phantom line, i.e., a dashed line) which feeds the value of PSV_local back to PS voltage adjuster 452. In such embodiments, PS voltage adjuster 452, and thus controller 448A, is configured to cause the value of a local PS voltage PSV_local to be increased or decreased by PSV generator 456 based in part on (A) the feedback value of local PSV voltage PSV_local and (B) the first and second temperature-comparison results from temperature comparator 444 and/or the voltage-comparison result from threshold voltage comparator 446.

In some embodiments, DDVFS device 442A of FIG. 4A includes temperature comparator 444 but does not include threshold voltage comparator 446. Such embodiments are shown in FIGS. 4B, 4C and 4F as corresponding DDVFS devices 442B, 442C and 442F.

Figure 4B:
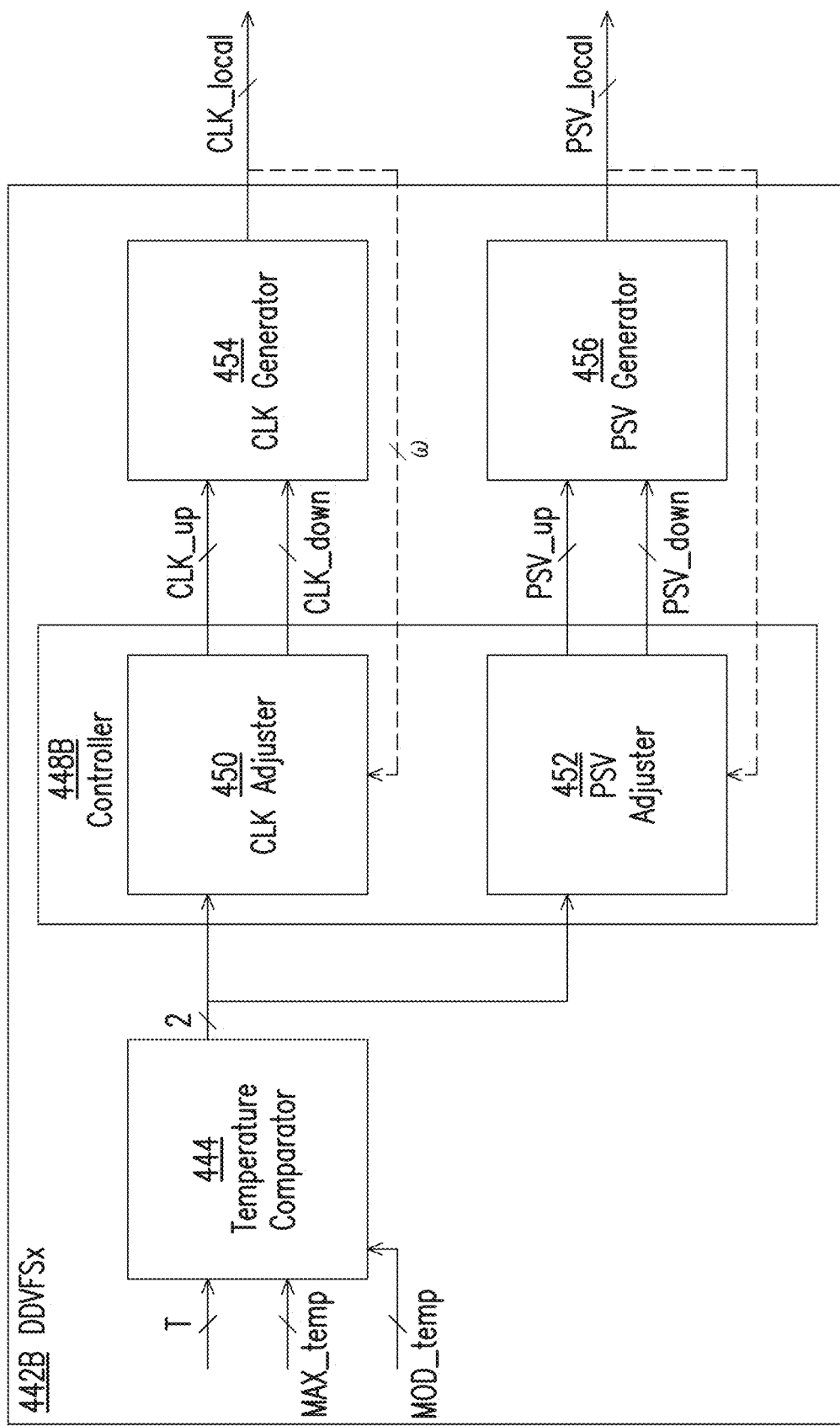
Figure 4C:
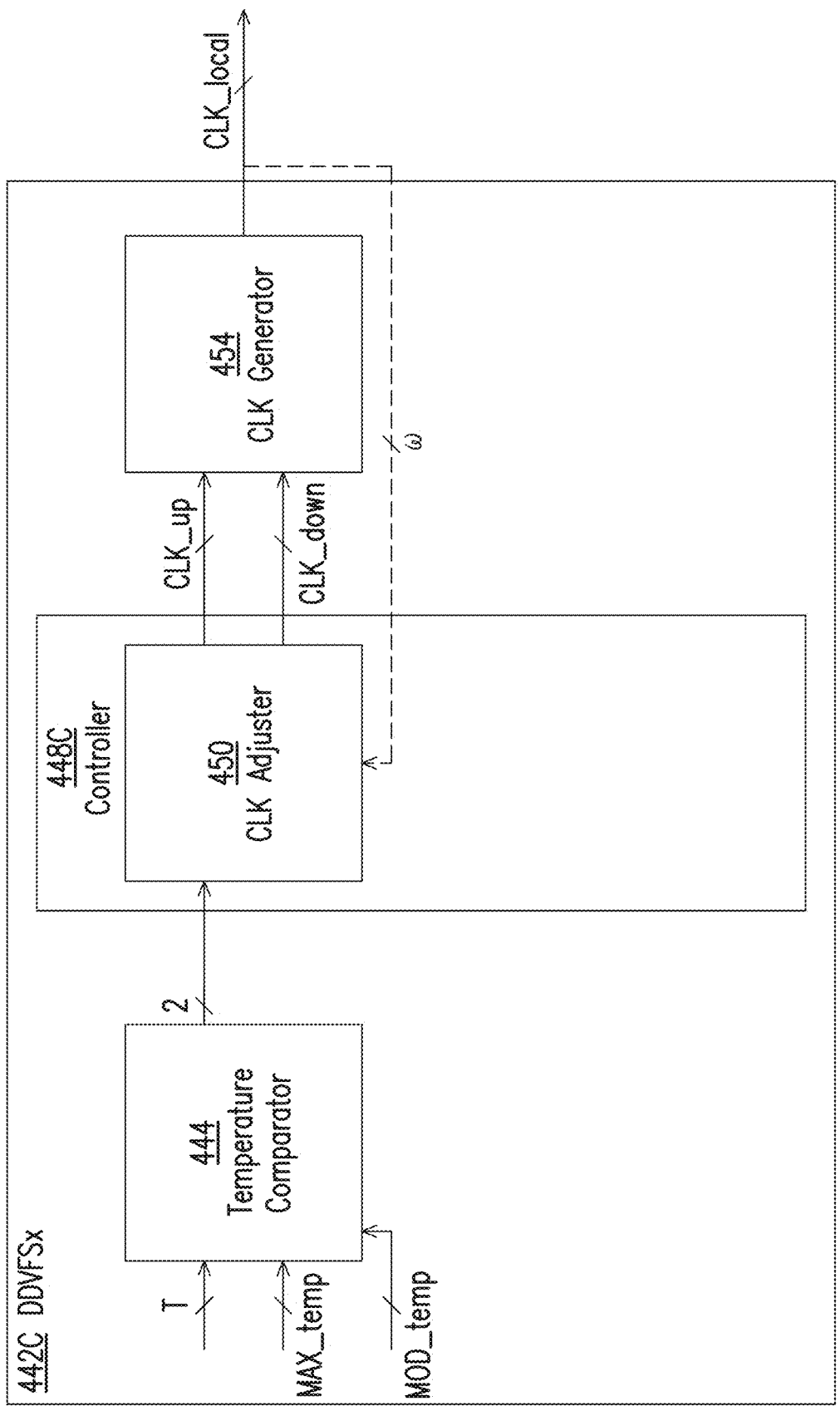

In some embodiments, DDVFS device 442B of FIG. 4B, and more particularly, controller 445B, includes clock adjuster 450 but does not include PS voltage adjuster 452. Such embodiments are shown as DDVFS device 442C of FIG. 4C. In some embodiments, DDVFS device 442B of FIG. 4B, and more particularly, controller 445B, includes PS voltage adjuster 452 but does not include clock adjuster 450. Such embodiments are shown as DDVFS device 442F of FIG. 4F.

In some embodiments, DDVFS device 442A of FIG. 4A includes threshold voltage comparator 446 but does not include temperature comparator 444. Such embodiments are shown in FIGS. 4D, 4E and 4G as corresponding DDVFS devices 442D, 442E and 442G.

Figure 4D:
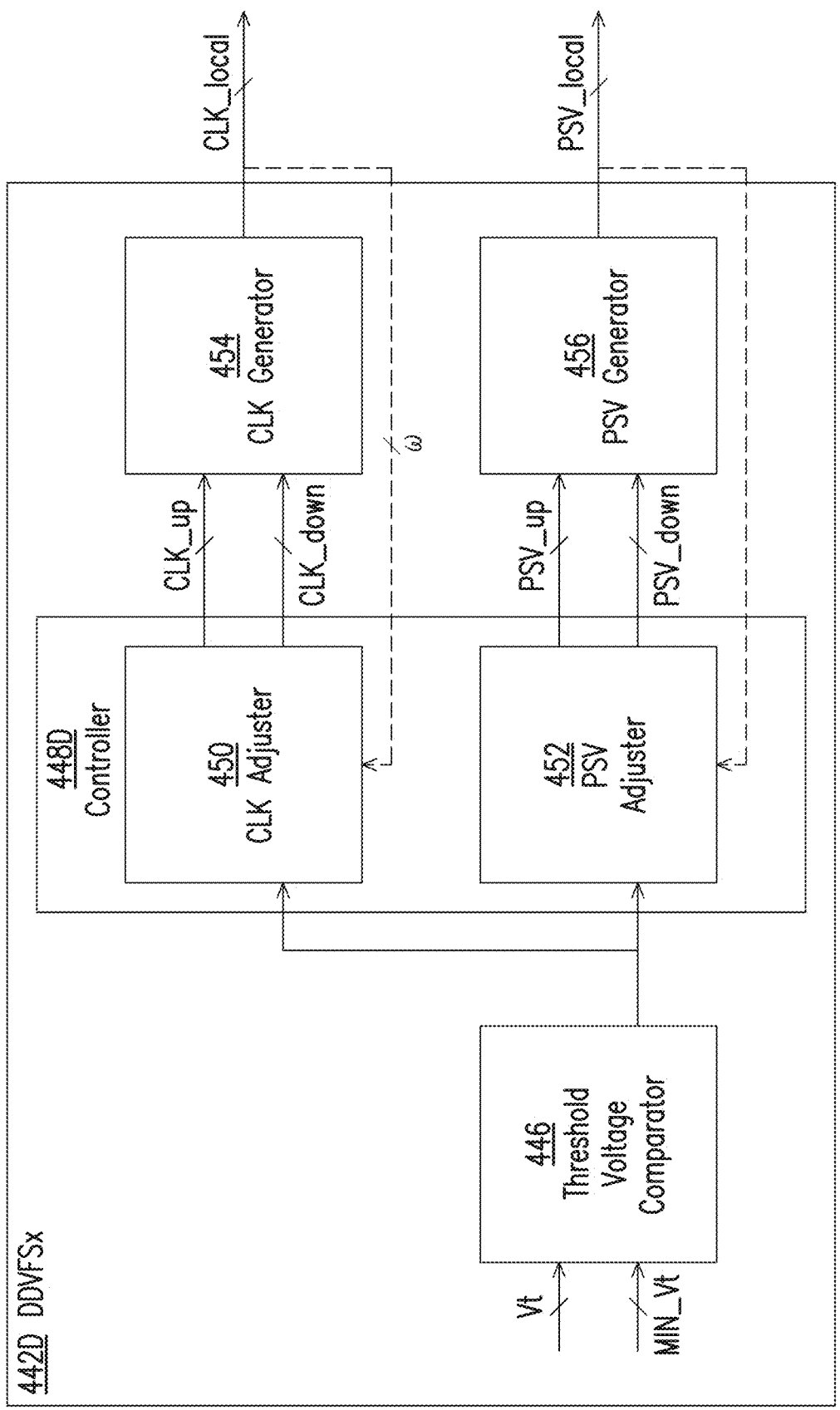
Figure 4E:
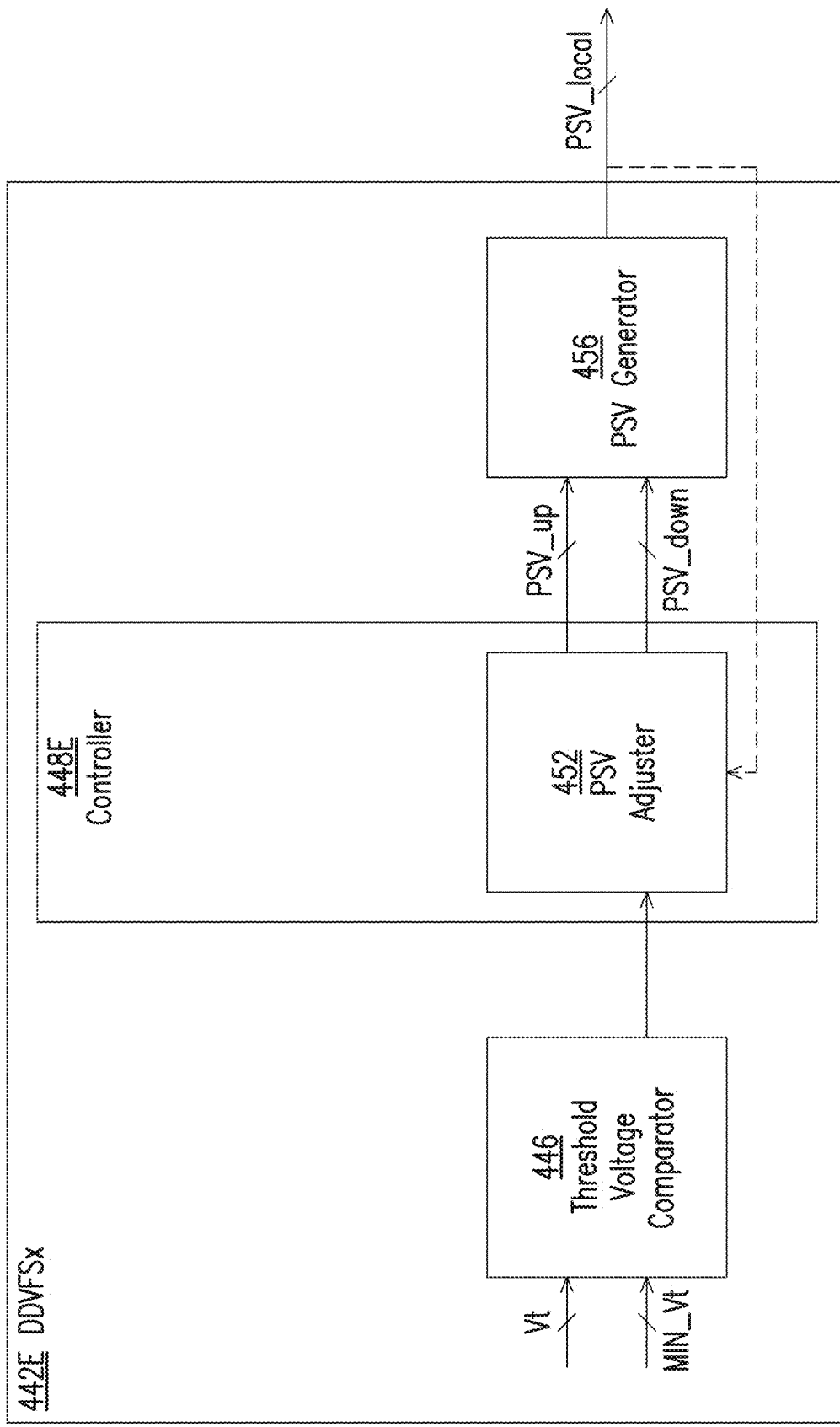
Figure 4F:
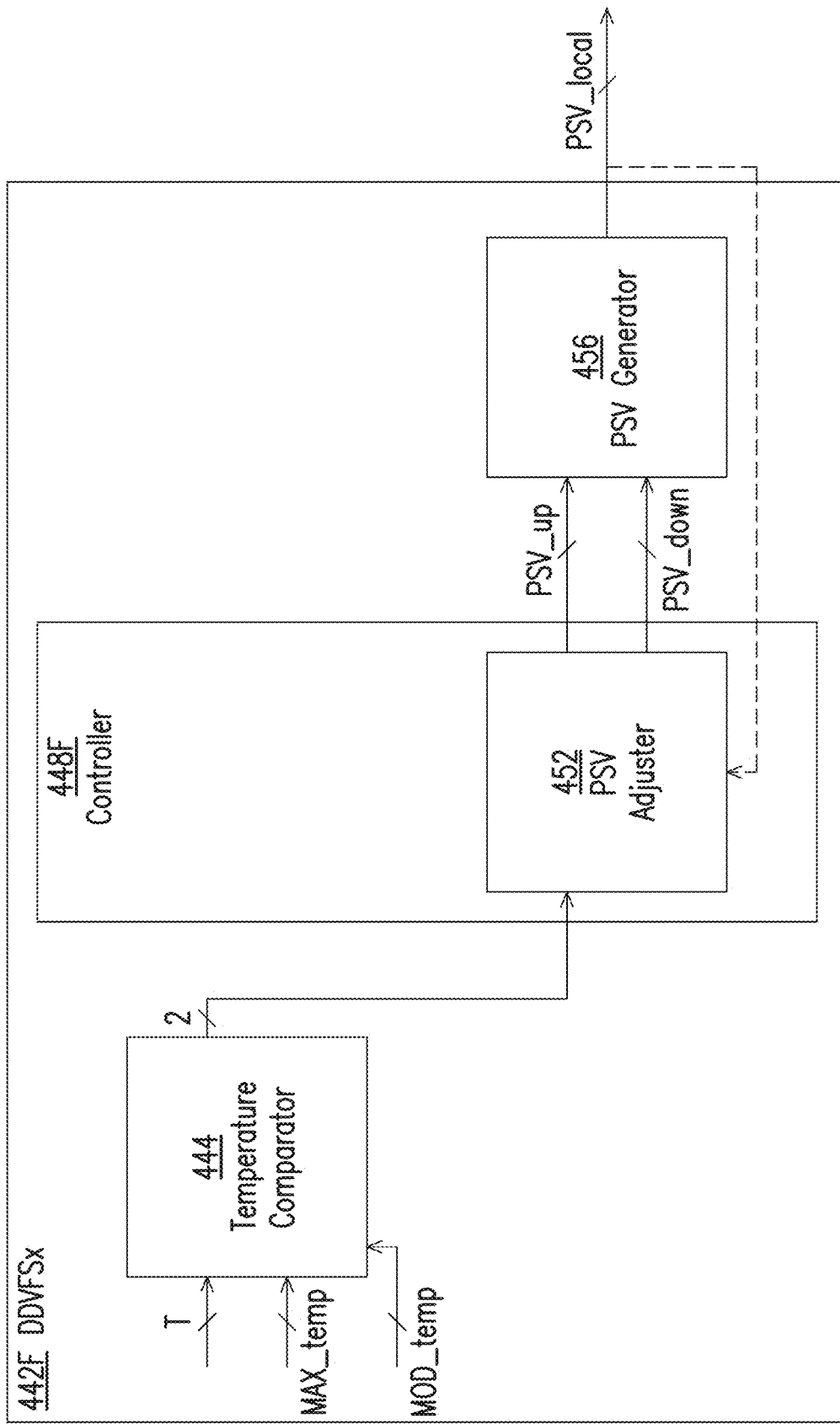
Figure 4G:
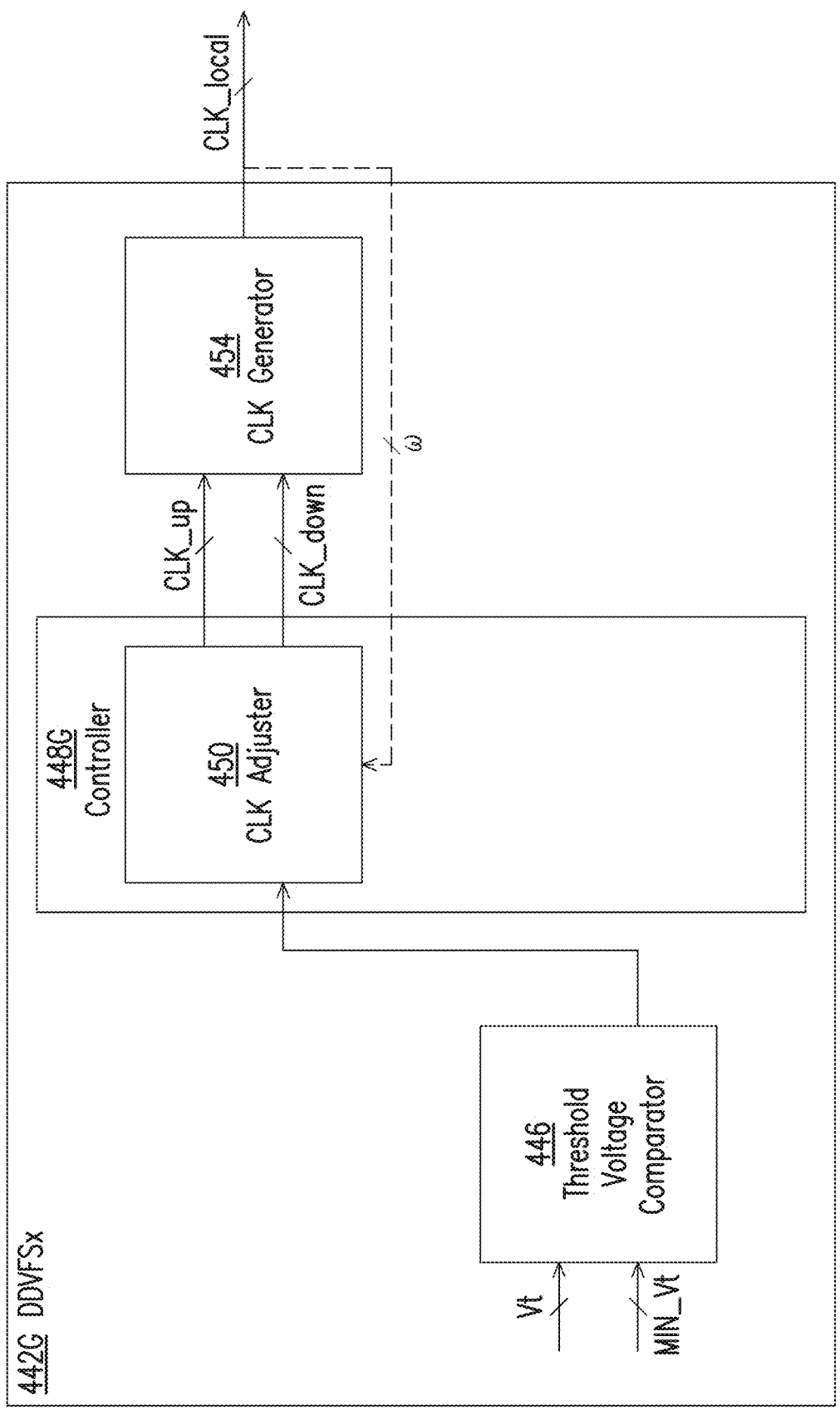

In some embodiments, DDVFS device 442D of FIG. 4D, and more particularly, controller 445D, includes PS voltage adjuster 452 but does not include clock adjuster 450. Such embodiments are shown as DDVFS device 442E of FIG. 4E. In some embodiments, DDVFS device 442D of FIG. 4D, and more particularly, controller 445D, includes clock adjuster 450 but does not include PS voltage adjuster 452. Such embodiments are shown as DDVFS device 442G of FIG. 4G.

Figure 5B:
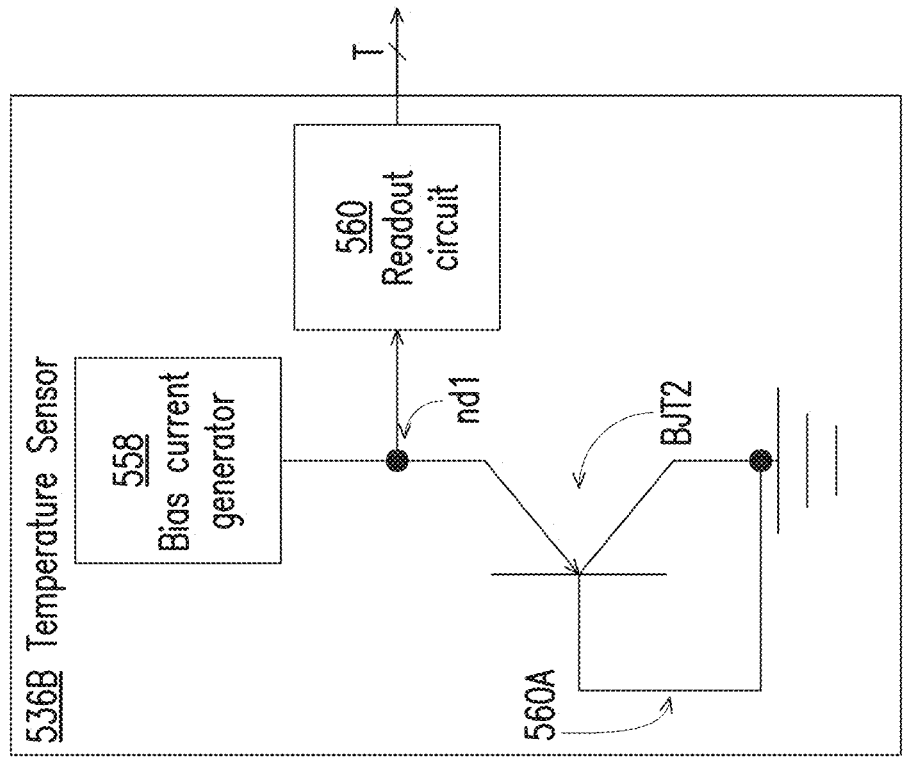
FIGS. 5A-5B are circuit diagrams of corresponding temperature sensors, in accordance with some embodiments.
Figure 5A:
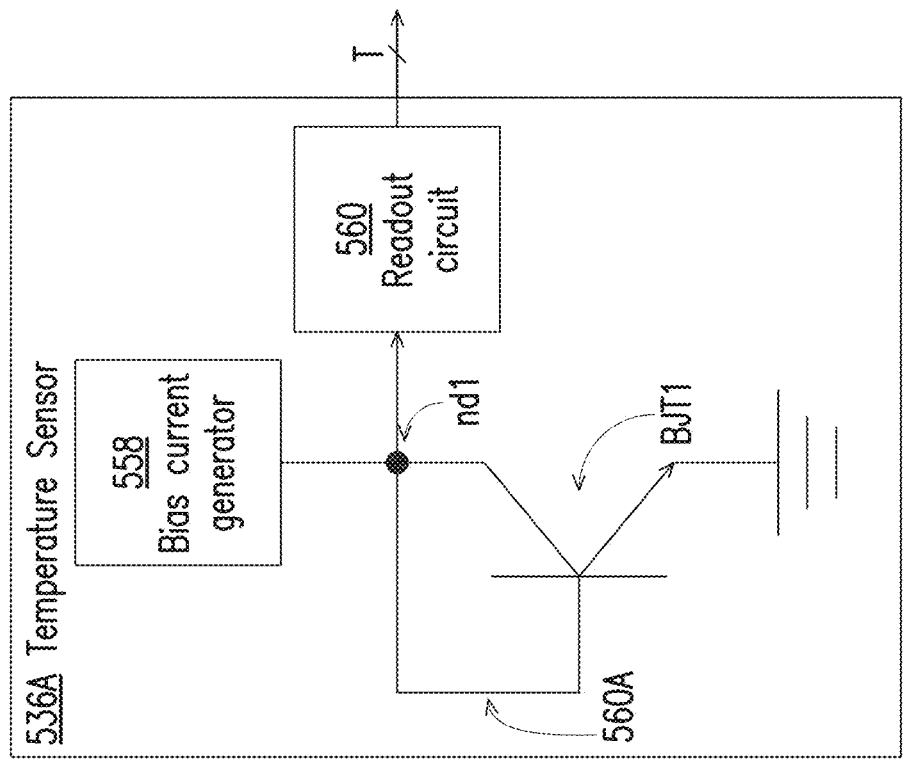

FIGS. 5A-5B are circuit diagrams of corresponding temperature sensors 522A-522B, in accordance with some embodiments.

Each of temperature sensors 522A-522B includes a bias current generator 558, a bipolar junction transistor (BJT) and a readout circuit 560. Bias current generator 558 is electrically coupled to a node nd1. Details of typical bias current generators are found, e.g., in U.S. Pat. No. 8,183,910, granted May 22, 2012, or U.S. Pat. No. 9,166,067, granted Oct. 20, 2015, the entireties of each of which are hereby incorporated by reference. Readout circuit 560 is electrically coupled to node nd1 and is configured to generate temperature T. In some embodiments, readout circuit 560 includes a buffer circuit.

In FIG. 5A, transistor BJT1 is an NPN type of BJT which is electrically coupled between node nd1 and a low system voltage, e.g., ground, as contrasted with a high system voltage, VDD. In some embodiments, ground is VSS. Transistor BJT1 has a diode configuration in which the base terminal of BJT1 is electrically coupled to the collector terminal, i.e., to node nd1.

In FIG. 5B, transistor BJT2 is a PNP type of BJT which is electrically coupled between node nd1 and ground. Transistor BJT2 has a diode configuration such that the base terminal of BJT2 is electrically coupled to the emitter terminal, i.e., to ground.

Figure 6C:
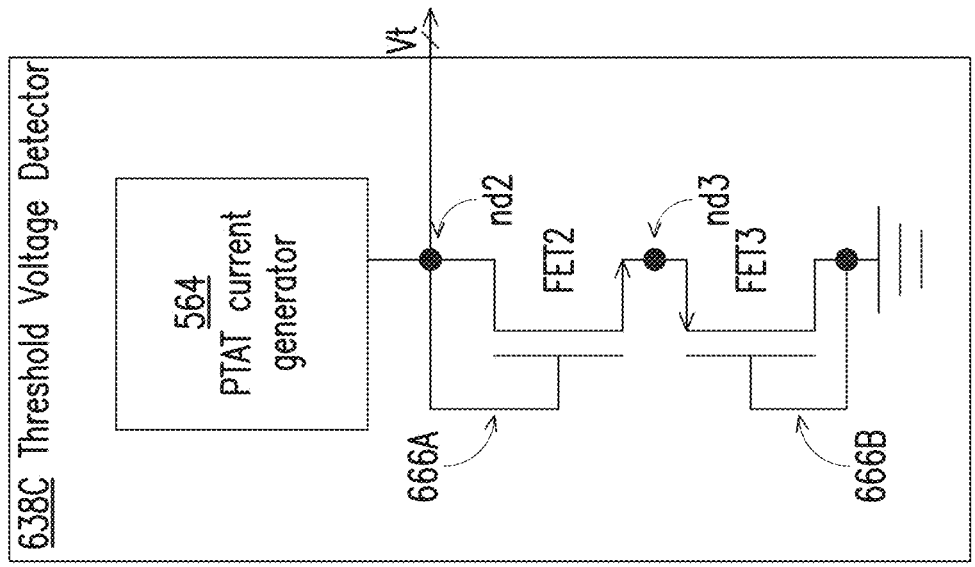
FIGS. 6A-6C are circuit diagrams of corresponding threshold voltage detectors, in accordance with some embodiments.
Figure 6B:
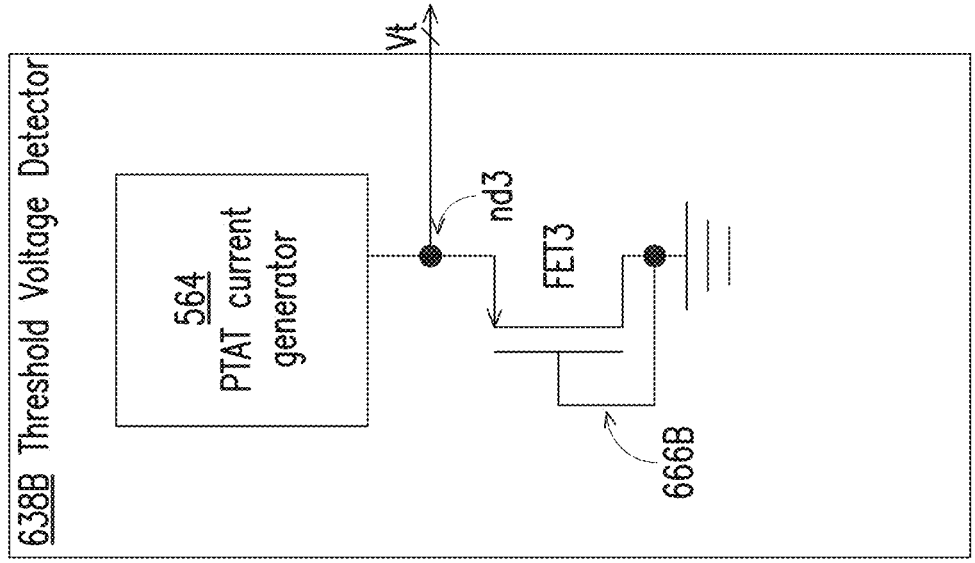
Figure 6A:
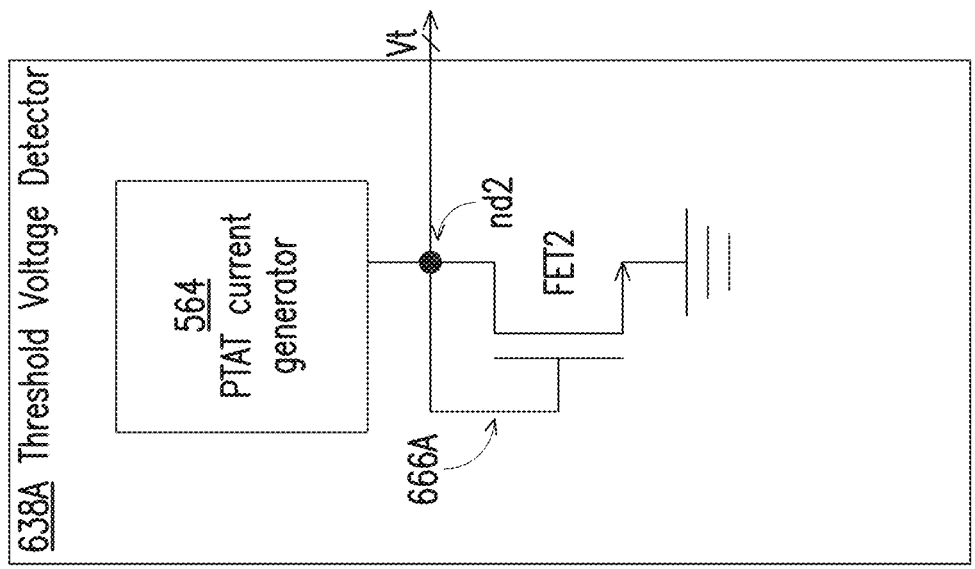

FIGS. 6A-6C are circuit diagrams of corresponding threshold voltage detectors 622A-622C, in accordance with some embodiments.

Each of threshold voltage detectors 622A-622C includes a proportional to absolute temperature (PTAT) current generator 564 and one or more field-effect transistors (FETs). PTAT current generator 564 is electrically coupled to a node nd2. In some embodiments (not shown), each of voltage detectors 622A-622C includes a complementary to absolute temperature (CTAT) circuit. Details of typical PTAT current generators are found, e.g., in U.S. Pat. No. 8,183,910, granted May 22, 2012, or U.S. Pat. No. 9,166,067, granted Oct. 20, 2015, the entireties of each of which are hereby incorporated by reference.

In FIG. 6A, threshold voltage detector 638A includes a transistor FET2, which is an N-type FET transistor, and which is electrically coupled between node nd2 and a low system voltage, e.g., ground, as contrasted with a high system voltage, VDD. In some embodiments, ground is VSS. Transistor FET2 has a diode configuration in which the gate terminal of FET2 is electrically coupled to the drain terminal, i.e., to node nd2. The signal on node nd2 represents threshold voltage Vt.

In FIG. 6B, threshold voltage detector 638B includes a transistor FET3, which is a P-type FET transistor, and which is electrically coupled between node nd2 and ground. Transistor FET3 has a diode configuration in which the gate terminal of FET3 is electrically coupled to the drain terminal, i.e., to ground. The signal on node nd2 represents threshold voltage Vt.

Regarding FIG. 6C, threshold voltage detector 638C is a combination of threshold voltage detectors 638a and 638B. More particularly, threshold voltage detector 638C includes both FET2 of FIG. 6A and FET3 of FIG. 6B. In FIG. 6C, diode-configured FET2 is electrically coupled between node nd2 and a node nd3, and diode-configured FET3 is electrically coupled between node nd3 and ground. The signal on node nd2 represents threshold voltage Vt.

FIGS. 7A-7E are corresponding flowcharts 700A-700E, in accordance with some embodiments.

More particularly, flowcharts 700A-700E are corresponding methods of differentiated thermal throttling of a high bandwidth memory (HBM). Examples of an HBM include HBM 204 of FIG. 2B, HBMs 204A-304D of corresponding FIGS. 3A-3D, or the like. Flowchart 700A includes block 702A, 704A and 706A.

At block 702A, from each of first and second sensing units which are arranged correspondingly in core dies, first and second instances of a temperature signal and/or first and second instances of a threshold voltage signal are received. The first and second instance of the temperature signal and the first and second instances of the threshold voltage signal are associated with first and second transistors in corresponding first and second memory cells of corresponding first and second banks of corresponding core dies.

Regarding block 702A, examples of the first and second sensing units are corresponding instances of sensing unit 235C of FIG. 2C, or the like, where sensing unit 235C is an example of each instance of each of sensing units S0-S7 in FIG. 2B. Examples of the first and second temperature signals are corresponding instances of temperature T generated by corresponding instances of temperature sensor 236 of FIG. 2C which are in corresponding instances of sensing unit 235C, or the like. Examples of the first and second threshold voltage signals are corresponding instances of threshold voltage Vt generated by corresponding instances of threshold voltage detector 238 of FIG. 2C in corresponding instances of sensing unit 235C, or the like. Examples of the first and second transistors in corresponding first and second memory cells of corresponding first and second banks of corresponding core dies are first and second instances of transistor FET1 in corresponding first and second instances of memory cell MC of corresponding first and second ones of banks B0-B7 of corresponding ones of core dies 218(0)-218(3) of FIG. 2B. From block 702A, flow proceeds to block 704A.

At block 704A, a first clock and/or a first PS voltage of one or more memory cells in a first set is/are adjusted based correspondingly on the first temperature (see block 702A) and/or the first threshold voltage (see block 702A). The first set is comprised of corresponding one or more banks of the HBM. Such adjustment thereby changes corresponding temperatures in the one or more memory cells of the first set. In some embodiments, both of the first clock and the first PS voltage of the one or more memory cells in the first set are adjusted. In some embodiments, the first clock and/or the first PS voltage is/are adjusted based on the first temperature and the first threshold voltage. In some embodiments, the first clock and/or the first PS voltage is/are adjusted based on only the first temperature. In some embodiments, the first clock and/or the first PS voltage is/are adjusted based on only the first threshold voltage.

Regarding block 704A, examples of adjusting the first clock include decreasing or increasing a frequency of the first clock, or the like. An example of adjusting the first PS voltage includes decreasing a value/magnitude of the first PS voltage, or the like. Examples of changing a temperature in a memory cell include decreasing or increasing a temperature of the memory cell. Examples of the first clock include a first instance of local clock signal CLK_local in each of FIGS. 4A-4D, local clock signal CLK_bnk in FIG. 3A, local clock signal CLK_grp in FIG. 3B, local clock signal CLK_chan in FIG. 3C, local clock signal CLK_core in FIG. 3D, or the like. Examples of the first PS voltage include a first instance of local PS voltage PSV_local in each of FIGS. 4A-4D, local PS voltage PSV_bnk in FIG. 3A, local PS voltage PSV_grp in FIG. 3B, local PS voltage PSV_chan in FIG. 3C, local PS voltage PSV_core in FIG. 3D, or the like. From block 704A, flow proceeds to block 706A.

At block 706A, a second clock or a second PS voltage of one or more memory cells in a second set is/are adjusted based correspondingly on the second temperature (see block 702A) and/or the second threshold voltage (see block 702A). The second set is comprised of corresponding one or more banks of corresponding of the HBM. Such adjustment thereby changes corresponding temperatures in the one or more memory cells of the second set. In some embodiments, in terms of membership, the first and second sets are non-overlapping of each other. In some embodiments, the second clock and/or the second PS voltage is/are adjusted based on the second temperature and the second threshold voltage. In some embodiments, the second clock and/or the second PS voltage is/are adjusted based on only the second temperature. In some embodiments, the second clock and/or the second PS voltage is/are adjusted based on only the second threshold voltage.

Regarding block 706A, examples of adjusting the second clock include decreasing or increasing a frequency of the second clock, or the like. An example of adjusting the second PS voltage includes decreasing a value/magnitude of the second PS voltage, or the like. Examples of changing a temperature in a memory cell include decreasing or increasing a temperature of the memory cell. Examples of the second clock include a second instance of local clock signal CLK_local in each of FIGS. 4A-4D, local clock signal CLK_bnk in FIG. 3A, local clock signal CLK_grp in FIG. 3B, local clock signal CLK_chan in FIG. 3C, local clock signal CLK_core in FIG. 3D, or the like. Examples of the second PS voltage include a second instance of local PS voltage PSV_local in each of FIGS. 4A-4D, local PS voltage PSV_bnk in FIG. 3A, local PS voltage PSV_grp in FIG. 3B, local PS voltage PSV_chan in FIG. 3C, local PS voltage PSV_core in FIG. 3D, or the like.

Figure 7A:
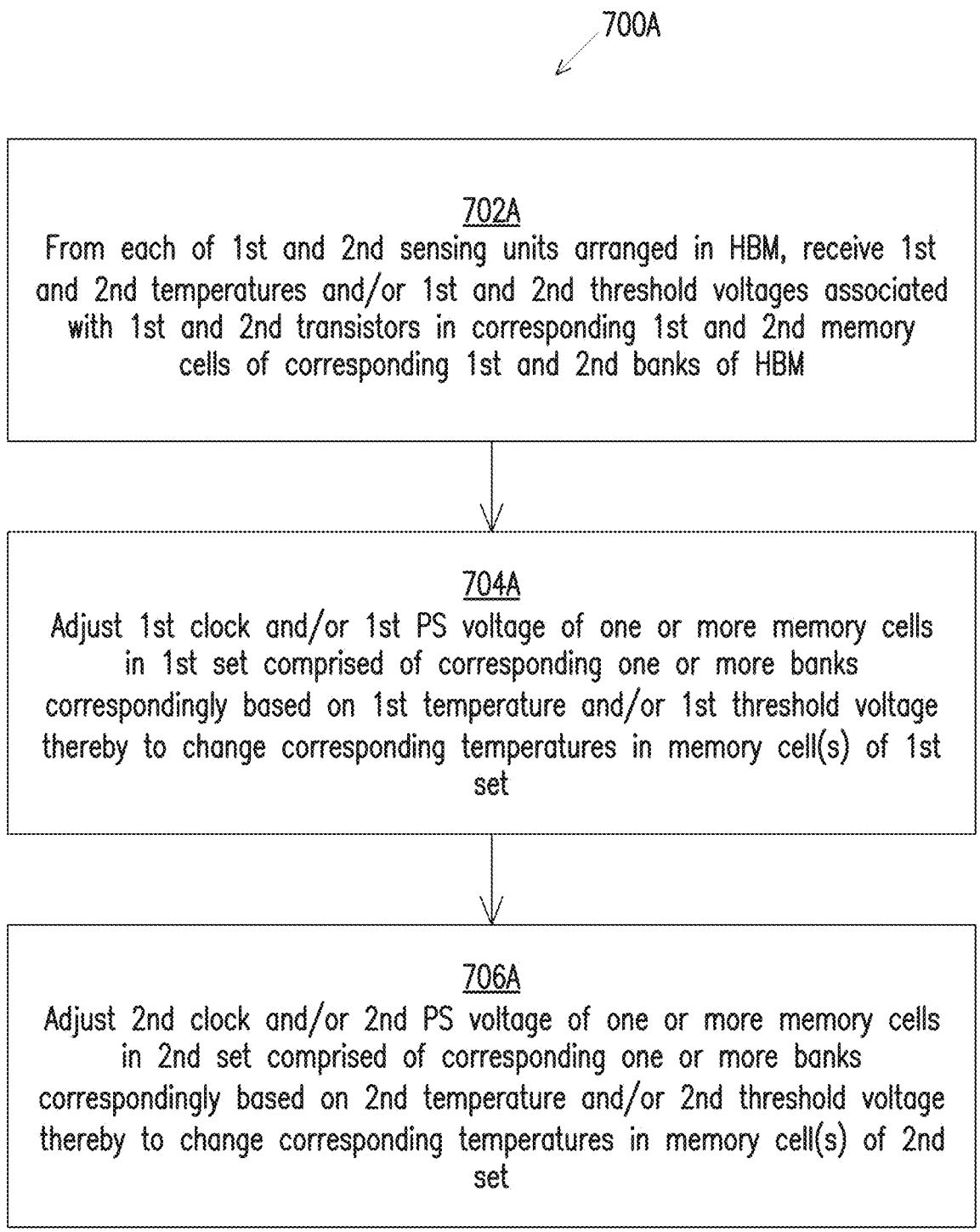
FIGS. 7A-7E are corresponding flowcharts, in accordance with some embodiments.
Figure 7B:
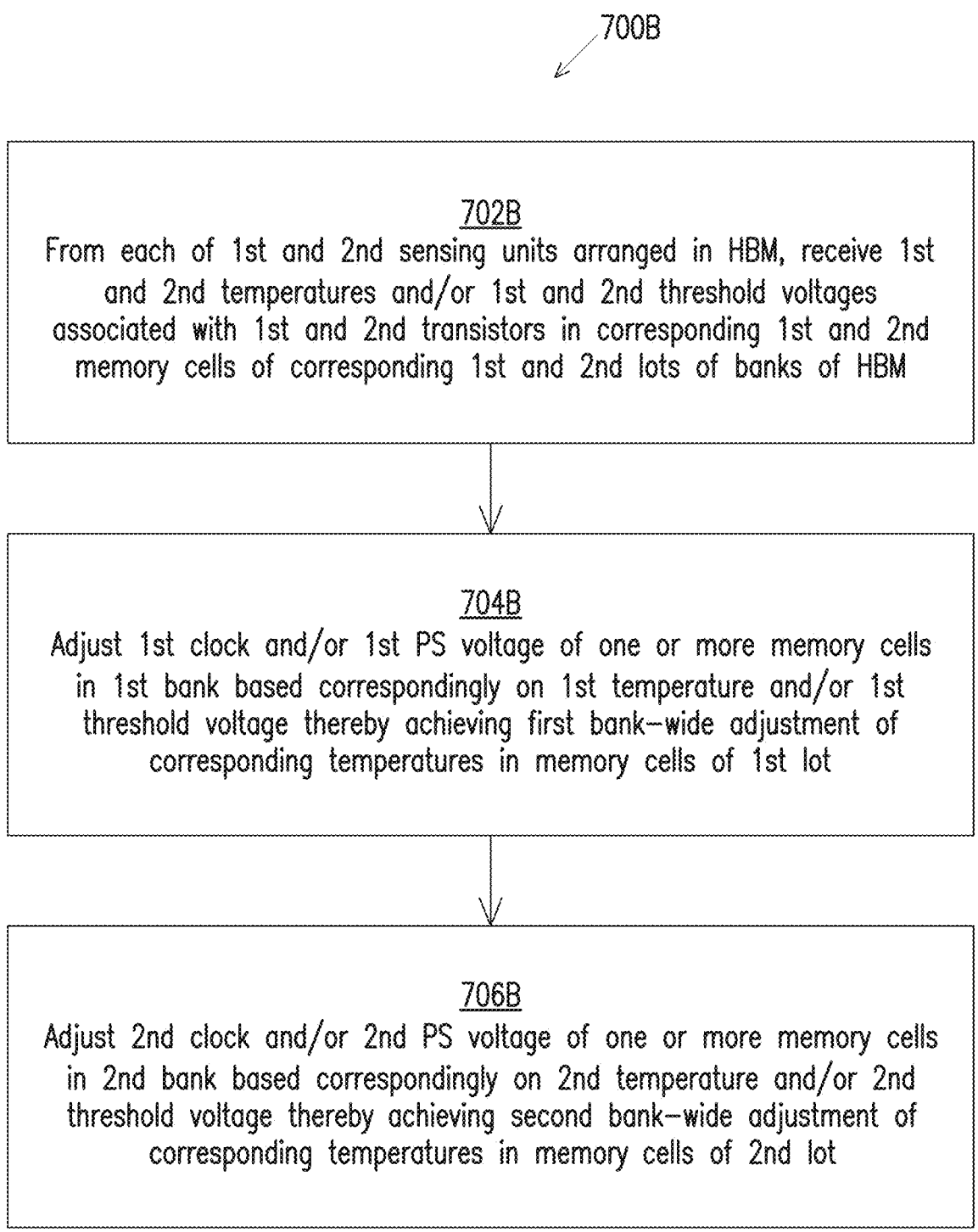

Turning now to FIG. 7B, flowchart 700B is a bank-wide type of differentiated thermal throttling of an HBM. An example of the HBM is HBM 304A of FIG. 3A.

In FIG. 7B, flowchart 700B includes blocks 702B, 704B and 706B. Flowchart 700B assumes a scenario in which a first set of one or more of the memory cells in the HBM is contained within at least a first lot of one or more of the banks of the HBM, and a second set of one or more of the memory cells is contained within at least a second lot of one of the banks of the HBM. In terms of membership, in some embodiments, the first and second lots are non-overlapping of each other.

Block 702B is similar to block 702A, the latter having been discussed above in the context of FIG. 7A. At block 702B, from each of first and second sensing units, first and second instances of a temperature signal and/or first and second instances of a threshold voltage signal are received. The first and second instance of the temperature signal and the first and second instances of the threshold voltage signal are associated with first and second transistors in corresponding first and second memory cells of the corresponding first and second lots of corresponding one or more banks. From block 702B, flow proceeds to block 704B.

Block 704B is similar to block 704A, the latter having been discussed above in the context of FIG. 7A. At block 704B, a first clock and/or a first PS voltage of one or more memory cells in the first bank is/are adjusted correspondingly on the first temperature (see block 702B) and/or the first threshold voltage (sec block 702B). Such adjustment thereby achieves bank-wide adjustment of corresponding temperatures in the one or more memory cells of the first lot. In some embodiments, both of the first clock and the first PS voltage of the first bank are adjusted. An example of bank-wide adjustment is the arrangement of DDVFS device 340 in HBM 304A of FIG. 3A. In some embodiments, the first clock and/or the first PS voltage is/are adjusted based on the first temperature and the first threshold voltage. In some embodiments, the first clock and/or the first PS voltage is/are adjusted based on only the first temperature. In some embodiments, the first clock and/or the first PS voltage is/are adjusted based on only the first threshold voltage. From block 704B, flow proceeds to block 706B.

Block 706B is similar to block 706A, the latter having been discussed above in the context of FIG. 7A. At block 706B, a second clock and/or a second PS voltage of one or more memory cells in the second bank is/are adjusted based correspondingly on the second temperature (see block 702B) and/or the second threshold voltage (see block 702B). Such adjustment thereby achieves bank-wide adjustment of corresponding temperatures in the one or more memory cells of the second lot. In some embodiments, both of the second clock and the second PS voltage of the one or more memory cells in the second bank are adjusted. An example of bank-wide adjustment is the arrangement of DDVFS device 340 in HBM 304A of FIG. 3A. In some embodiments, the second clock and/or the second PS voltage is/are adjusted based on the second temperature and the second threshold voltage. In some embodiments, the second clock and/or the second PS voltage is/are adjusted based on only the second temperature. In some embodiments, the second clock and/or the second PS voltage is/are adjusted based on only the second threshold voltage.

Figure 7C:
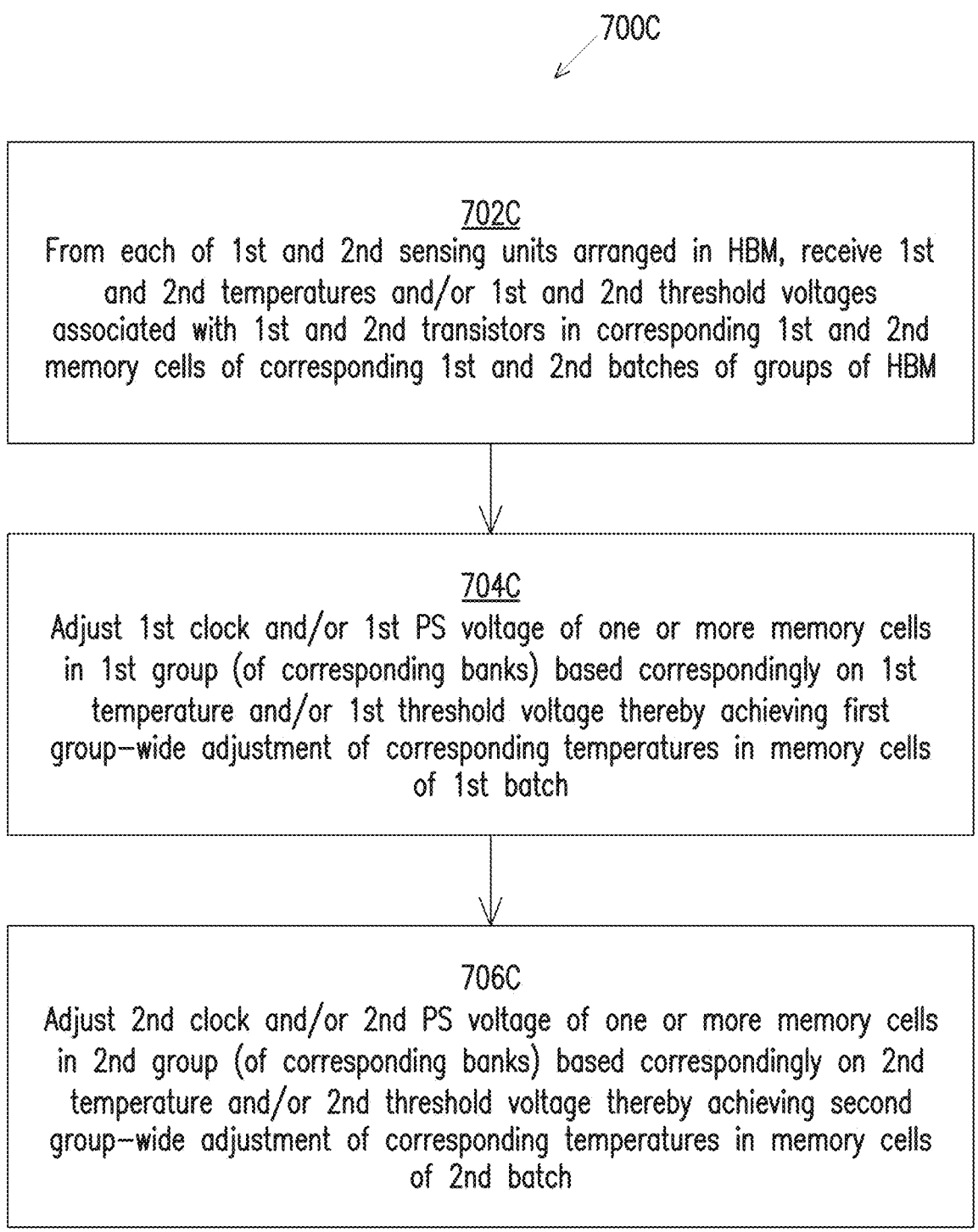

Turning now to FIG. 7C, flowchart 700C is a group-wide type of differentiated thermal throttling of an HBM. An example of the HBM is HBM 304B of FIG. 3B.

In FIG. 7C, flowchart 700C includes blocks 702C, 704C and 706C. Flowchart 700C assumes a scenario in which a first set of one or more of the memory cells in the HBM is contained within at least a first batch of one or more groups of the HBM, and a second set of one or more of the memory cells is contained within at least a second batch of one or more groups of the HBM. In terms of membership, in some embodiments, the first and second batches are non-overlapping of each other.

Block 702C is similar to block 702B, the latter having been discussed above in the context of FIG. 7B. At block 702C, from each of first and second sensing units, first and second instances of a temperature signal and/or first and second instances of a threshold voltage signal are received. The first and second instance of the temperature signal and the first and second instances of the threshold voltage signal are associated with first and second transistors in corresponding first and second memory cells of the corresponding first and second batches. From block 702C, flow proceeds to block 704C.

Block 704C is similar to block 704B, the latter having been discussed above in the context of FIG. 7B. At block 704C, a first clock and/or a first PS voltage of one or more memory cells in the first group is/are adjusted correspondingly on the first temperature (see block 702C) and/or the first threshold voltage (see block 702C). Such adjustment thereby achieves group-wide adjustment of corresponding temperatures in the one or more memory cells of the first batch. In some embodiments, both of the first clock and the first PS voltage of the first group are adjusted. An example of group-wide adjustment is the arrangement of DDVFS device 340 in HBM 304B of FIG. 3B. In some embodiments, the first clock and/or the first PS voltage is/are adjusted based on the first temperature and the first threshold voltage. In some embodiments, the first clock and/or the first PS voltage is/are adjusted based on only the first temperature. In some embodiments, the first clock and/or the first PS voltage is/are adjusted based on only the first threshold voltage. From block 704C, flow proceeds to block 706C.

Block 706C is similar to block 706B, the latter having been discussed above in the context of FIG. 7B. At block 706C, a second clock and/or a second PS voltage of one or more memory cells in the second group is/are adjusted based correspondingly on the second temperature (see block 702C) and/or the second threshold voltage (see block 702C). Such adjustment thereby achieves group-wide adjustment of corresponding temperatures in the one or more memory cells of the second batch. In some embodiments, both of the second clock and the second PS voltage of the one or more memory cells in the second group are adjusted. An example of group-wide adjustment is the arrangement of DDVFS device 340 in HBM 304B of FIG. 3B. In some embodiments, the second clock and/or the second PS voltage is/are adjusted based on the second temperature and the second threshold voltage. In some embodiments, the second clock and/or the second PS voltage is/are adjusted based on only the second temperature. In some embodiments, the second clock and/or the second PS voltage is/are adjusted based on only the second threshold voltage.

Figure 7D:
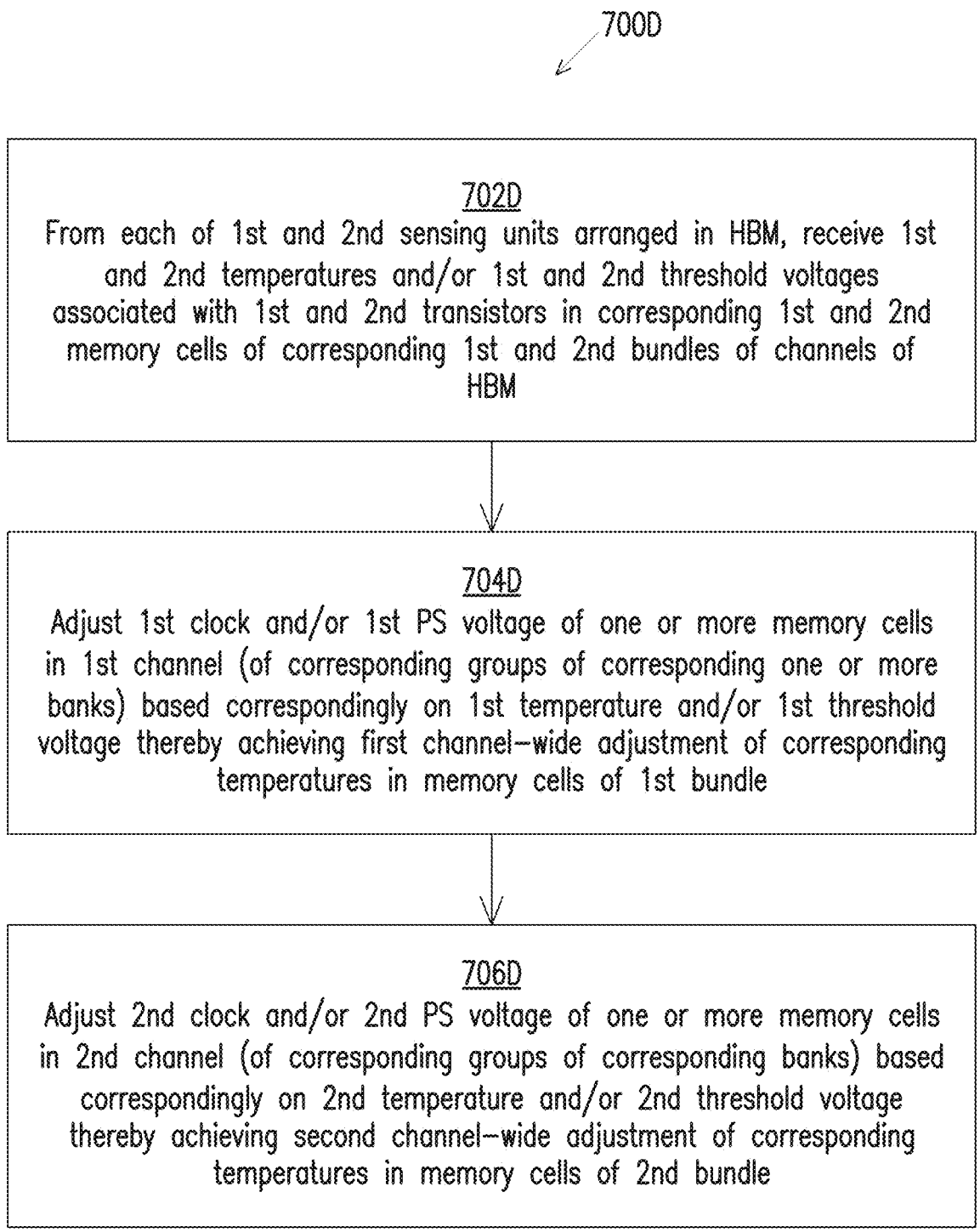

Turning now to FIG. 7D, flowchart 700D is a channel-wide type of differentiated thermal throttling of an HBM. An example of the HBM is HBM 304C of FIG. 3C.

In FIG. 7D, flowchart 700D includes blocks 702D, 704D and 706D. Flowchart 700D assumes a scenario in which a first set of one or more of the memory cells in the HBM is contained within at least a first bundle of one or more channels of the HBM, and a second set of one or more of the memory cells is contained within at least a second bundles of one or more channels of the HBM. In terms of membership, in some embodiments, the first and second bundles are non-overlapping of each other.

Block 702D is similar to block 702B, the latter having been discussed above in the context of FIG. 7C. At block 702D, from each of first and second sensing units, first and second instances of a temperature signal and/or first and second instances of a threshold voltage signal are received. The first and second instance of the temperature signal and the first and second instances of the threshold voltage signal are associated with first and second transistors in corresponding first and second memory cells of the corresponding first and second bundles of corresponding one or more channels. From block 702D, flow proceeds to block 704D.

Block 704D is similar to block 704B, the latter having been discussed above in the context of FIG. 7C. At block 704D, a first clock and/or a first PS voltage of one or more memory cells in the first channel is/are adjusted based correspondingly on the first temperature (see block 702D) and/or the first threshold voltage (see block 702D). Such adjustment thereby achieves channel-wide adjustment of corresponding temperatures in the one or more memory cells of the first bundle. In some embodiments, both of the first clock and the first PS voltage of the first channel are adjusted. An example of channel-wide adjustment is the arrangement of DDVFS device 340 in HBM 304C of FIG. 3C. In some embodiments, the first clock and/or the first PS voltage is/are adjusted based on the first temperature and the first threshold voltage. In some embodiments, the first clock and/or the first PS voltage is/are adjusted based on only the first temperature. In some embodiments, the first clock and/or the first PS voltage is/are adjusted based on only the first threshold voltage. From block 704D, flow proceeds to block 706D.

Block 706D is similar to block 706B, the latter having been discussed above in the context of FIG. 7C. At block 706D, a second clock and/or a second PS voltage of one or more memory cells in the second channel is/are adjusted based correspondingly on the second temperature (see block 702D) and/or the second threshold voltage (see block 702D). Such adjustment thereby achieves channel-wide adjustment of corresponding temperatures in the one or more memory cells of the second bundle. In some embodiments, both of the second clock and the second PS voltage of the one or more memory cells in the second channel are adjusted. An example of channel-wide adjustment is the arrangement of DDVFS device 340 in HBM 304C of FIG. 3C. In some embodiments, the second clock and/or the second PS voltage is/are adjusted based on the second temperature and the second threshold voltage. In some embodiments, the second clock and/or the second PS voltage is/are adjusted based on only the second temperature. In some embodiments, the second clock and/or the second PS voltage is/are adjusted based on only the second threshold voltage.

Figure 7E:
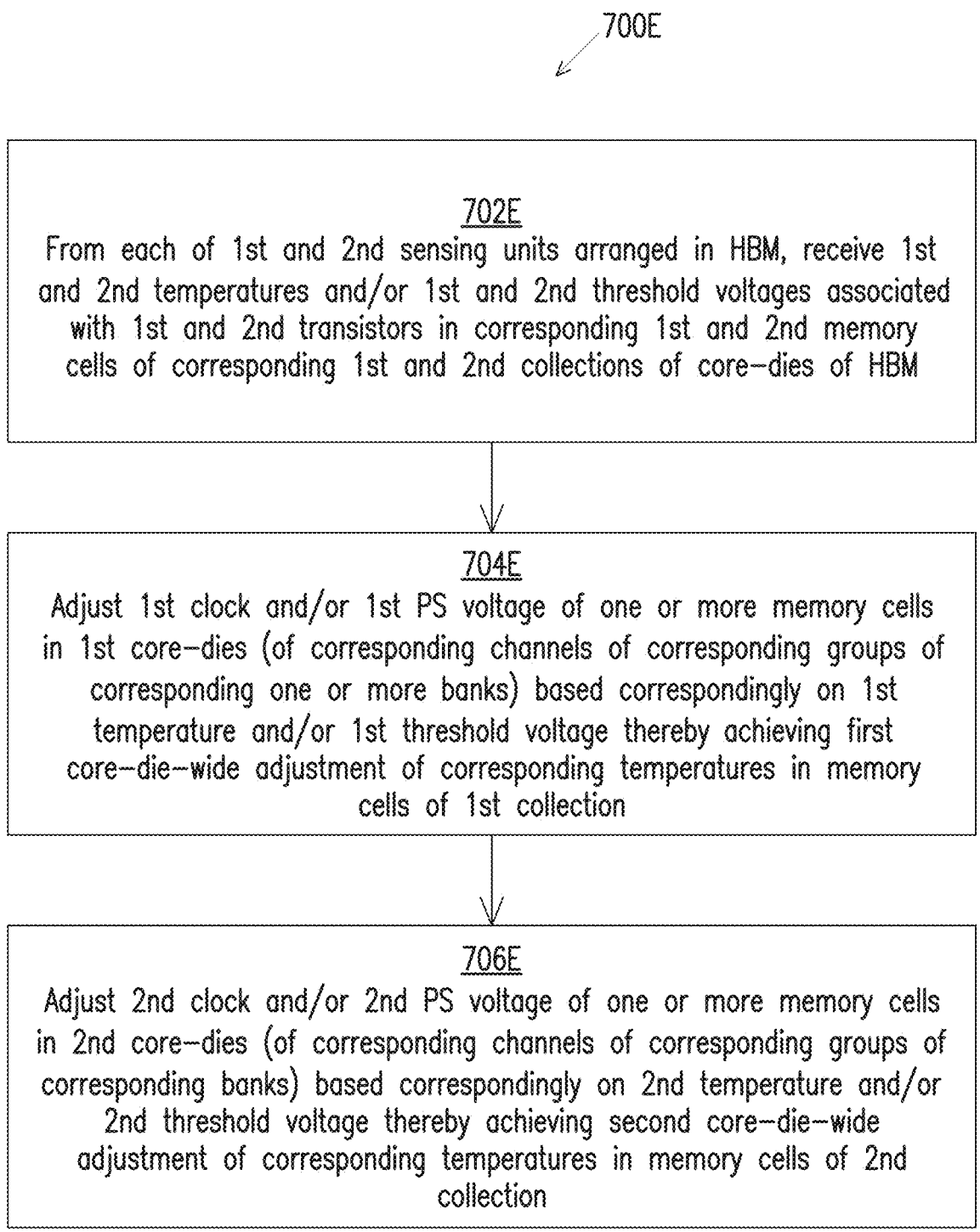

Turning now to FIG. 7E, flowchart 700E is a core-die-wide type of differentiated thermal throttling of an HBM. An example of the HBM is HBM 304D of FIG. 3D.

In FIG. 7E, flowchart 700E includes blocks 702E, 704E and 706E. Flowchart 700E assumes a scenario in which a first set of one or more of the memory cells in the HBM is contained within at least a first collection of one or more core-dies of the HBM, and a second set of one or more of the memory cells is contained within at least a second collection of one or more core-dies of the HBM. In terms of membership, in some embodiments, the first and second collections are non-overlapping of each other.

Block 702E is similar to block 702B, the latter having been discussed above in the context of FIG. 7D. At block 702E, from each of first and second sensing units, first and second instances of a temperature signal and/or first and second instances of a threshold voltage signal are received. The first and second instance of the temperature signal and the first and second instances of the threshold voltage signal are associated with first and second transistors in corresponding first and second memory cells of the corresponding first and second collections of corresponding one or more core-dies. From block 702E, flow proceeds to block 704E.

Block 704E is similar to block 704B, the latter having been discussed above in the context of FIG. 7D. At block 704E, a first clock and/or a first PS voltage of one or more memory cells in the first core-die is/are adjusted based correspondingly on the first temperature (see block 702E) and/or the first threshold voltage (see block 702E). Such adjustment thereby achieves core-die-wide adjustment of corresponding temperatures in the one or more memory cells of the first collection. In some embodiments, both of the first clock and the first PS voltage of the first core-die are adjusted. An example of core-die-wide adjustment is the arrangement of DDVFS device 340 in HBM 304D of FIG. 3D. In some embodiments, the first clock and/or the first PS voltage is/are adjusted based on the first temperature and the first threshold voltage. In some embodiments, the first clock and/or the first PS voltage is/are adjusted based on only the first temperature. In some embodiments, the first clock and/or the first PS voltage is/are adjusted based on only the first threshold voltage. From block 704E, flow proceeds to block 706E.

Block 706E is similar to block 706B, the latter having been discussed above in the context of FIG. 7D. At block 706E, a second clock and/or a second PS voltage of one or more memory cells in the second core-die is/are adjusted based correspondingly on the second temperature (sec block 702E) and/or the second threshold voltage (sec block 702E). Such adjustment thereby achieves core-die-wide adjustment of corresponding temperatures in the one or more memory cells of the second collection. In some embodiments, both of the second clock and the second PS voltage of the one or more memory cells in the second core-die are adjusted. An example of core-die-wide adjustment is the arrangement of DDVFS device 340 in HBM 304D of FIG. 3D. In some embodiments, the second clock and/or the second PS voltage is/are adjusted based on the second temperature and the second threshold voltage. In some embodiments, the second clock and/or the second PS voltage is/are adjusted based on only the second temperature. In some embodiments, the second clock and/or the second PS voltage is/are adjusted based on only the second threshold voltage.

FIG. 7F is a flowchart showing blocks 704A and 706A in more detail, in accordance with some embodiments.

In FIG. 7F, block 704A includes blocks 730-734 and block 706A includes blocks 736-740.

At block 730, the first temperature is compared against a first temperature-reference which yields first temperature-comparison results. The first temperature-reference represents a maximum temperature. An example of the first temperature-reference is temperature-reference MAX_temp of FIGS. 4A-4C and 4F, or the like. Examples of comparing the first temperature against the first temperature-reference are the comparisons performed by temperature comparator 444 of FIGS. 4A-4C and 4F, or the like. From block 730, flow proceeds to block 732.

At block 732, a frequency of the first clock is altered based on the first temperature-comparison results (see block 730). An example of such alteration is reducing the frequency of the first clock, e.g., as in the coordinated operation of clock adjuster 450 and CLK generator 454 of FIGS. 4A-4C, or the like. From block 732, flow proceeds to block 734.

At block 734, a value of the first PS voltage is altered based on the first temperature-comparison results (see block 730). An example of such alteration is reducing the value/magnitude of the first PS voltage, e.g., as in the coordinated operation of PSV adjuster 452 and PSV generator 456 of FIGS. 4A-4B and 4F, or the like. From block 734, flow proceeds to block 736 in block 706A.

At block 736, the second temperature is compared against the first temperature-reference which yields second temperature-comparison results. Examples of comparing the second temperature against the second temperature-reference are the comparisons performed by temperature comparator 444 of FIGS. 4A-4C, or the like. From block 736, flow proceeds to block 738.

At block 738, a frequency of the second clock is altered based on the first temperature-comparison results (see block 736). An example of such alteration is reducing the frequency of the second clock, e.g., as in the coordinated operation of clock adjuster 450 and CLK generator 454 of FIGS. 4A-4C, or the like. From block 738, flow proceeds to block 740.

At block 740, a value of the second PS voltage is altered based on the second temperature-comparison results (see block 736). An example of such alteration is reducing the value/magnitude of the second PS voltage, e.g., as in the coordinated operation of PSV adjuster 452 and PSV generator 456 of FIGS. 4A-4B and 4F, or the like.

FIG. 7G is a flowchart showing blocks 704A and 706A in more detail, in accordance with some embodiments.

In FIG. 7G, block 704A includes blocks 750-754 and block 706A includes blocks 756-760.

At block 750, the first threshold voltage is compared against a first voltage-reference which yields first voltage-comparison results. The first voltage-reference represents a minimum threshold voltage. An example of the first voltage-reference is voltage-reference MIN_Vt of FIGS. 4A, 4D-4E and 4G, or the like. Examples of comparing the first voltage against the first voltage-reference are the comparisons performed by threshold voltage comparator 446 of FIGS. 4A, 4C-4D and 4G, or the like. From block 750, flow proceeds to block 752.

At block 752, a frequency of the first clock is altered based on the first voltage-comparison results (see block 750). An example of such alteration is reducing the frequency of the first clock, e.g., as in the coordinated operation of clock adjuster 450 and CLK generator 454 of FIGS. 4A, 4D and 4G, or the like. From block 752, flow proceeds to block 754.

At block 754, a value of the first PS voltage is altered based on the first threshold voltage-comparison results (see block 750). An example of such alteration is reducing the value/magnitude of the first PS voltage, e.g., as in the coordinated operation of PSV adjuster 452 and PSV generator 456 of FIGS. 4A and 4D-4E, or the like. From block 754, flow proceeds to block 756 in block 706A.

At block 756, the second threshold voltage is compared against a first threshold voltage-reference which yields second threshold voltage-comparison results. Examples of comparing the second threshold voltage against the second threshold voltage reference are the comparisons performed by threshold voltage comparator 444 of FIGS. 4A-4C and 4F, or the like. From block 756, flow proceeds to block 758.

At block 758, a frequency of the second clock is altered based on the second threshold voltage-comparison results (see block 756). An example of such alteration is reducing the frequency of the second clock, e.g., as in the coordinated operation of clock adjuster 450 and CLK generator 454 of FIGS. 4A, 4D and 4G, or the like. From block 758, flow proceeds to block 760.

At block 760, a value of the second PS voltage is altered based on the second threshold voltage-comparison results (see block 756). An example of such alteration is reducing the value/magnitude of the second PS voltage, e.g., as in the coordinated operation of PSV adjuster 452 and PSV generator 456 of FIGS. 4A and 4D-4E, or the like.

FIG. 7H is a flowchart showing blocks 704A and 706A in more detail, in accordance with some embodiments.

In FIG. 7H, block 704A includes blocks 770-774 and block 706A includes blocks 776-780.

At block 770, the first temperature is compared against a second temperature-reference which yields third temperature-comparison results. The second temperature-reference represents a moderate temperature. An example of the second temperature-reference is temperature-reference MOD_temp of FIGS. 4A-4C and 4F, or the like. Examples of comparing the first temperature against the second temperature-reference are the comparisons performed by temperature comparator 444 of FIGS. 4A-4C and 4F, or the like. From block 770, flow proceeds to block 772.

At block 772, a frequency of the first clock is altered based on the third temperature-comparison results (see block 770). More specifically, the frequency of the first clock is increased at block 772. An example of such alteration is increasing the frequency of the first clock, e.g., as in the coordinated operation of clock adjuster 450 and CLK generator 454 of FIGS. 4A-4C, or the like. From block 772, flow proceeds to block 774.

At block 774, a value of the first PS voltage is altered based on the third temperature-comparison results (see block 770). More specifically, the value of the first PS voltage is increased at block 774. An example of such alteration is increasing the value/magnitude of the first PS voltage, e.g., as in the coordinated operation of PSV adjuster 452 and PSV generator 456 of FIGS. 4A-4B and 4F, or the like. From block 774, flow proceeds to block 776 in block 706A.

At block 776, the second temperature is compared against the second temperature-reference which yields fourth temperature-comparison results. Examples of comparing the second temperature against the second temperature-reference are the comparisons performed by temperature comparator 444 of FIGS. 4A-4C and 4F, or the like. From block 776, flow proceeds to block 778.

At block 778, a frequency of the second clock is altered based on the fourth temperature-comparison results (see block 776). More specifically, the frequency of the second clock is increased at block 778. An example of such alteration is increasing the frequency of the second clock, e.g., as in the coordinated operation of clock adjuster 450 and CLK generator 454 of FIGS. 4A-4C, or the like. From block 778, flow proceeds to block 780.

At block 780, a value of the second PS voltage is altered based on the fourth temperature-comparison results (see block 776). More specifically, the value of the second PS voltage is increased at block 780. An example of such alteration is increasing the value/magnitude of the second PS voltage, e.g., as in the coordinated operation of PSV adjuster 452 and PSV generator 456 of FIGS. 4A-4B and 4F, or the like.

FIG. 7I is a flowchart showing blocks 704A and 706A in more detail, in accordance with some embodiments.

In FIG. 7I, block 704A includes blocks 790-794 and block 706A includes blocks 796-799.

At block 790, it is determined if all members, e.g., memory cells MC, of the first set are idle. If so (i.e., when all members of the first set are idle/asleep), then flow proceeds to block 792. In some embodiments, the HBM, e.g., HBM 204 FIGS. 2A-2B, is included in an internet-of-things (IOT) device. It is common for an IoT device to be idle for a majority of the time.

At block 792, when all members of the first set are idle, a frequency of the first clock is reduced. An example of such alteration is reducing the frequency of the first clock, e.g., as in the coordinated operation of clock adjuster 450 and CLK generator 454 of FIGS. 4A-4C, or the like. From block 792, flow proceeds to block 794.

At block 794, a value of the first PS voltage is reduced. An example of such alteration is reducing the value/magnitude of the first PS voltage, e.g., as in the coordinated operation of PSV adjuster 452 and PSV generator 456 of FIGS. 4A-4B and 4F, or the like. From block 794, flow proceeds to block 796 in block 706A.

At block 796, it is determined if all members, e.g., memory cells MC, of the second set are idle. If so (i.e., when all members of the second set are idle), then flow proceeds to block 798.

At block 798, a frequency of the second clock is reduced. An example of such alteration is reducing the frequency of the second clock, e.g., as in the coordinated operation of clock adjuster 450 and CLK generator 454 of FIGS. 4A-4C, or the like. From block 798, flow proceeds to block 799.

At block 799, a value of the second PS voltage is reduced. An example of such alteration is reducing the value/magnitude of the second PS voltage, e.g., as in the coordinated operation of PSV adjuster 452 and PSV generator 456 of FIGS. 4A-4B and 4F, or the like.

Alternatively, in some embodiments, block 792 is not included and instead flow proceeds from block 790 to block 794. Alternatively, in some embodiments, block 794 is not included.

Alternatively, in some embodiments, block 798 is not included and instead flow proceeds from block 796 to block 799. Alternatively, in some embodiments, block 799 is not included.

In some embodiments, the value of the first and second PS voltages is reduced to about zero. In such embodiments, while the first and second PS voltages are set to about zero, the corresponding devices receiving the first and second PS voltages enjoy a reduction in power consumption of about 99%.

In some embodiments, the value of the first and second PS voltages is reduced to a lowest workable voltage, i.e., a lowest voltage at which the HBM will operate correctly/reliably. In such embodiments, while the first and second PS voltages are set to the lowest workable voltage, the corresponding devices receiving the first and second PS voltages enjoy a reduction in power consumption of about 1%.

Figure 8:
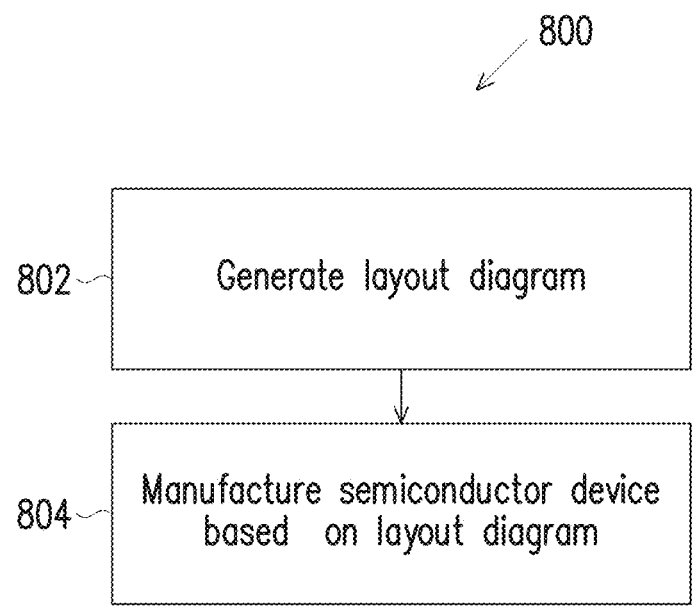
FIG. 8 is a flowchart of a method of manufacturing a semiconductor device, in accordance with some embodiments.

FIG. 8 is a flowchart of a method 800 of manufacturing a semiconductor device, in accordance with some embodiments.

Method 800 is implementable, for example, using EDA system 900 (FIG. 9, discussed below) and an integrated circuit (IC) manufacturing system 1000 (FIG. 10, discussed below), in accordance with some embodiments. Examples of a semiconductor device which can be manufactured according to method 800 include semiconductor device 100 of FIG. 1, semiconductor devices corresponding to various ones of the layout diagrams disclosed herein, or the like.

In FIG. 8, method 800 includes blocks 802-804. At block 802, a layout diagram is generated which, among other things, includes one or more of layout diagrams corresponding to semiconductor devices, e.g., FIG. 1, or the like, where the semiconductor devices are implementations of systems such as the systems disclosed herein, or the like. Block 802 is implementable, for example, using EDA system 900 (FIG. 9, discussed below), in accordance with some embodiments.

More particularly, block 802 includes generating shapes corresponding to structures in a semiconductor device resulting in a layout diagram in according to which the semiconductor device is manufacturable. From block 802, flow proceeds to block 804.

At block 804, based on the layout diagram, perform at least one of (A) one or more photolithographic exposures are made or (B) one or more semiconductor masks are fabricated or (C) one or more components in a layer of a semiconductor device are fabricated. See discussion below of FIG. 10.

Figure 9:
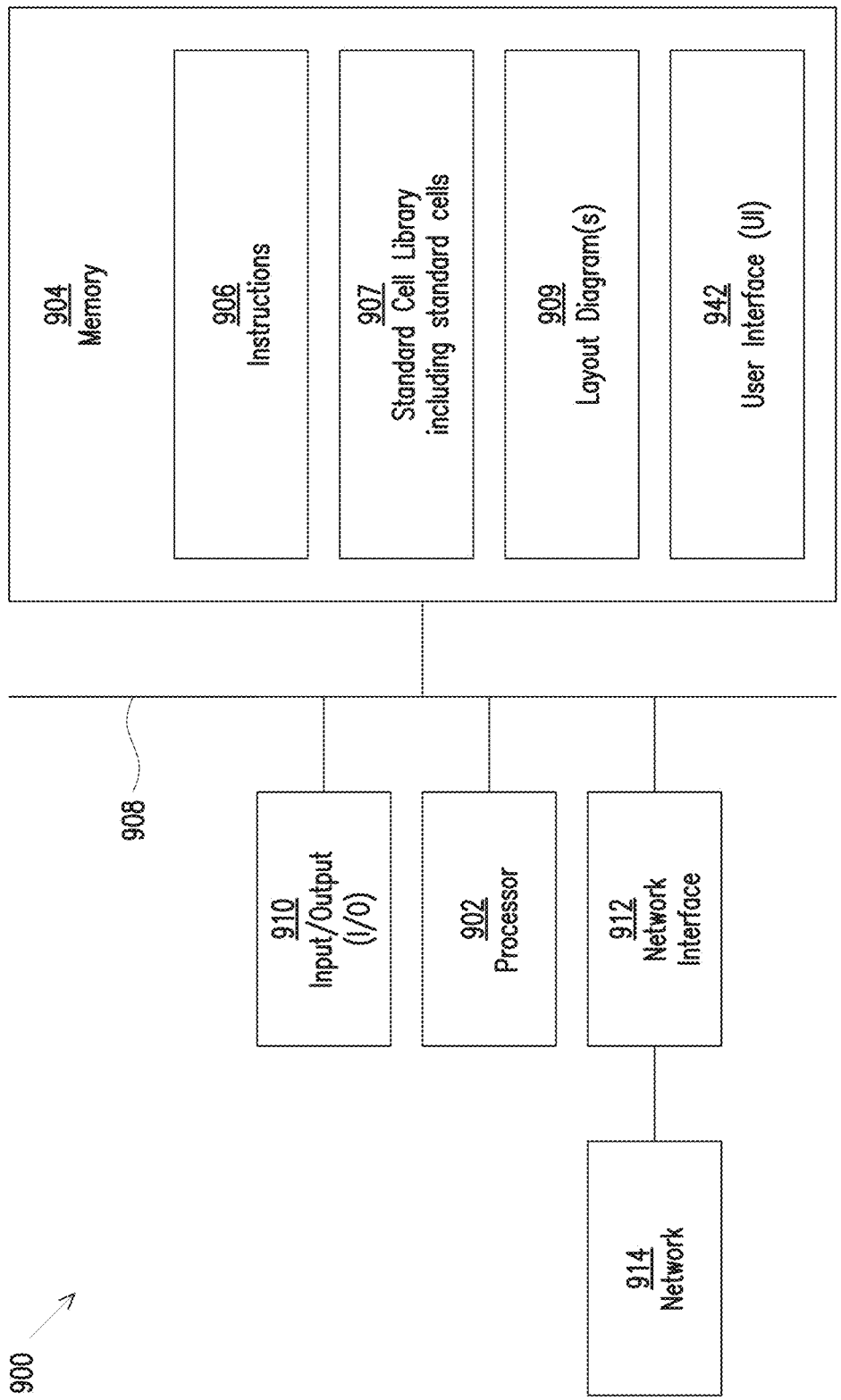
FIG. 9 is a block diagram of an electronic design automation (EDA) system in accordance with some embodiments.

FIG. 9 is a block diagram of an electronic design automation (EDA) system 900 in accordance with some embodiments.

In some embodiments, EDA system 900 includes an automatic placement and routing (APR) system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein. In one or more embodiments, storage medium 904 stores one or more layout diagrams 909 corresponding to one or more layout diagrams disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout-diagram-generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
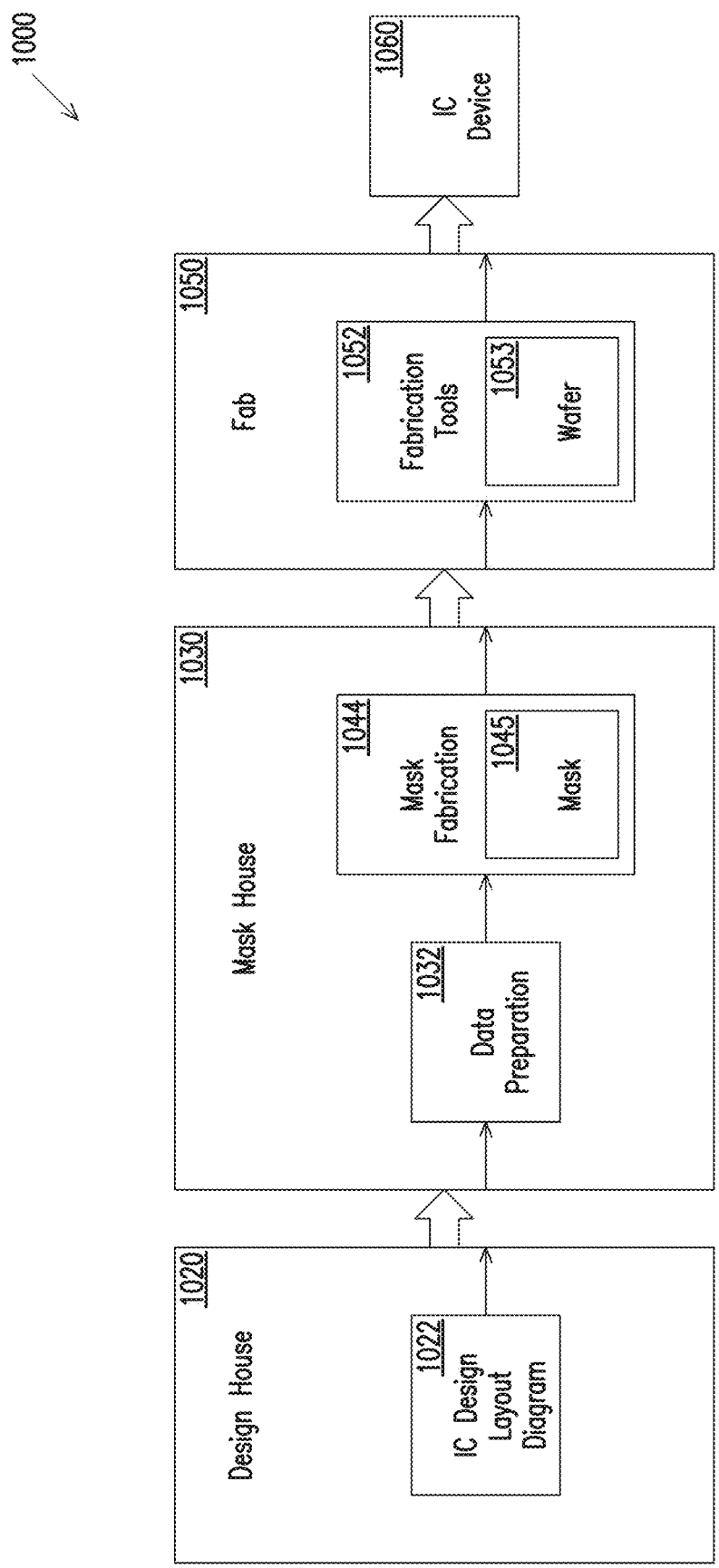
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator (fab) 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC layout diagram 1022. IC layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC layout diagram 1022. The design procedure includes one or more of logic design, physical design or place and route. IC layout diagram 1022 is presented in one or more data files having information of the geometrical patterns. For example, IC layout diagram 1022 can be expressed in a GDSII file format or DFII file format.

Mask house 1030 includes data preparation 1032 and mask fabrication 1044. Mask house 1030 uses IC layout diagram 1022 to manufacture one or more masks 1045 to be used for fabricating the various layers of IC device 1060 according to IC layout diagram 1022. Mask house 1030 performs mask data preparation 1032, where IC layout diagram 1022 is translated into a representative data file (RDF). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks IC layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies IC layout diagram 1022 to compensate for photolithographic implementation effects during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC layout diagram 1022.

It should be understood that the above description of mask data preparation 1032 has been simplified for the purposes of clarity. In some embodiments, data preparation 1032 includes additional features such as a logic operation (LOP) to modify IC layout diagram 1022 according to manufacturing rules. Additionally, the processes applied to IC layout diagram 1022 during data preparation 1032 may be executed in a variety of different orders.

After mask data preparation 1032 and during mask fabrication 1044, a mask 1045 or a group of masks 1045 are fabricated based on the modified IC layout diagram 1022. In some embodiments, mask fabrication 1044 includes performing one or more lithographic exposures based on IC layout diagram 1022. In some embodiments, an electron-beam (e-beam) or a mechanism of multiple e-beams is used to form a pattern on a mask (photomask or reticle) 1045 based on the modified IC layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a system (for controlling temperatures in a memory) includes: a high bandwidth memory (HBM) including core dies, the HBM being arranged into portions, each of the portions including memory cells, the HBM further including a first sensing unit configured to generate one or more first environmental signals corresponding to at least a first transistor in a corresponding at least a first one of the memory cells in a first one of the portions, and a second sensing unit configured to generate one or more second environmental signals corresponding to at least a second transistor in a corresponding at least a second one of the memory cells in a second one of the portions; and a differentiated dynamic voltage and frequency scaling (DDVFS) device configured to perform the following including, for a first set of one or more of the memory cells in the first portion which includes the first memory cell, controlling a temperature of the first set based on the one or more first environmental signals, and for a second set of one or more of the memory cells in the second portion which includes the second memory cell, controlling a temperature of the second set based on the one or more second environmental signals.

In some embodiments, in terms of membership, the first and second sets are non-overlapping of each other.

In some embodiments, the first sensing unit is further configured to sense a first temperature or detect a first threshold voltage corresponding to the at least the first transistor in the corresponding at least one of the memory cells of the first set; the second sensing unit is further configured to sense a second temperature or detect a second threshold voltage corresponding to the at least the second transistor in the corresponding at least one of the memory cells of the second set; the one or more first environmental signals include the first temperature or the first threshold voltage; the one or more second environmental signals include the second temperature or the second threshold voltage; and the DDVFS device is further configured to perform the following including adjusting a first clock or a first power supply (PS) voltage based on the first temperature or the first threshold voltage, and adjusting a second clock or a second PS voltage based on the second temperature or the second threshold voltage.

In some embodiments, each of the portions includes banks; the first set of one or more of the memory cells is contained within at least a first lot of one or more of the banks; the second set of one or more of the memory cells is contained within at least a second lot of one of the banks; in terms of membership, the first and second lots are non-overlapping of each other; and the DDVFS device is further configured to perform the following including adjusting the first clock or the first PS voltage of the first lot resulting in first bank-wide adjustment of corresponding temperatures amongst the memory cells of the banks of the first lot, and adjusting the second clock or the second PS voltage of the second lot resulting in second bank-wide adjustment of corresponding temperatures amongst the memory cells of the banks of the second lot.

In some embodiments, each of the portions includes banks; the banks of the HBM are arranged in corresponding groups; the first set of one or more of the memory cells is contained within at least a first block of one or more of the groups; the second set of one or more of the memory cells is contained within at least a second block of one or more of the groups; in terms of membership, the first and second blocks are non-overlapping of each other; and the DDVFS device is further configured to perform the following including adjusting the first clock or the first PS voltage of the first block resulting in a first group-wide adjustment of temperatures amongst the memory cells of the groups of the first block, and adjusting the second clock or the second PS voltage of the second block resulting in second group-wide adjustment of temperatures amongst the memory cells of the groups of the second block.

In some embodiments, each of the core dies of the HBM is arranged in channels; the first set of one or more of the memory cells is contained within at least a first bundle of one or more of the channels; the second set of one or more of the memory cells is contained within at least a second bundle of one or more of the channels; in terms of membership, the first and second bundles are non-overlapping of each other; and the DDVFS device is further configured to perform the following including adjusting the first clock or the first PS voltage of the first bundle resulting in a first channel-wide adjustment of temperatures amongst the memory cells of the channels of the first bundle, and adjusting the second clock or the second PS voltage of the second bundle resulting in a second channel-wide adjustment of temperatures amongst the memory cells of the channels of the second bundle.

In some embodiments, the first set of one or more of the memory cells is contained within a first collection of one or more of the core dies; the second set of one or more of the memory cells is contained within a second collection of one or more of the core dies; in terms of membership, the first and second collections are non-overlapping of each other; and the DDVFS device is further configured to perform the following including adjusting the first clock or the first PS voltage of the first collection resulting in a first core-die-wide adjustment of temperatures amongst the memory cells of the core dies of the first collection, and adjusting the second clock or the second PS voltage of the second collection resulting in a second core-die-wide adjustment of temperatures amongst the memory cells of the core dies of the second collection.

In some embodiments, the DDVFS device includes a controller configured to perform the following including: a scenario (A) including altering a frequency of the first clock based on the first temperature from the first sensing unit, and altering a frequency of the second clock based on the second temperature from the second sensing unit; or a scenario (B) including altering a value of the first PS voltage based on the second temperature from the first sensing unit, and altering a value of the second PS voltage based on the second temperature from the second sensing unit.

In some embodiments, the DDVFS device further includes a temperature comparator configured to perform the following including comparing the first temperature against a first temperature-reference representing a maximum temperature thereby yielding first temperature-comparison results, and comparing the second temperature against the first temperature-reference thereby yielding second temperature-comparison results; and the controller is further configured to perform the following including: executing a scenario (A) including altering the frequency of the first clock based on the first temperature-comparison results, and altering the frequency of the second clock based on the second temperature-comparison results; or executing a scenario (B) including altering the value of the first PS voltage based on the first temperature-comparison results, and altering the value of the second PS voltage based on the second temperature-comparison results.

In some embodiments, the temperature comparator is further configured to perform the following including comparing the first temperature against a second temperature-reference representing a moderate temperature thereby yielding third temperature-comparison results, and comparing the second temperature against the second temperature-reference thereby yielding fourth temperature-comparison results; when the third temperature-comparison results indicate that the first temperature is below the second temperature-reference, the controller is further configured to perform the following including increasing the frequency of the first clock or increasing the value of the first PS voltage; and when the second temperature-comparison results indicate that the second temperature is below the second temperature-reference, the controller is further configured to perform the following including increasing the frequency of the second clock or increasing the value of the second PS voltage.

In some embodiments, the DDVFS device further includes a threshold-voltage comparator configured to perform the following including comparing the first threshold voltage against a voltage-reference representing a minimum threshold-voltage thereby yielding first voltage-comparison results, and comparing the second threshold voltage against the voltage-reference thereby yielding second voltage-comparison results; and the controller is further configured to perform the following including: executing a scenario (A) including altering the frequency of the first clock based on the first voltage-comparison results, and altering the frequency of the second clock based on the second voltage-comparison results; or executing a scenario (B) including altering the value of the first PS voltage based on the first voltage-comparison results, and altering the value of the second PS voltage based on the second voltage-comparison results.

In some embodiments, when all members of the first set are idle, the controller is configured to perform the following including reducing the frequency of the first clock or reducing the value of the first PS voltage; and, when all members of the second set are idle, the controller is configured to perform the following including reducing the frequency of the second clock, or reducing the value of the second PS voltage.

In some embodiments, each of the first and second sensing units includes: a bias current generator electrically coupled to a first node; a diode-configured transistor electrically coupled between the first node and a ground voltage; and a readout circuit electrically coupled to the first node and configured correspondingly to output the first or second temperature.

In some embodiments, each of the first and second sensing units includes: a proportional to absolute temperature (PTAT) current generator electrically coupled to a first node; a diode-configured transistor electrically coupled between the first node and a ground voltage; and wherein a voltage on the first node correspondingly represents the first or second threshold voltage.

In some embodiments, a (system for controlling temperatures in a memory) includes: a high bandwidth memory (HBM) including core dies, the HBM being arranged into organizational units, each organizational unit including memory cells, the HBM further including a first sensing unit configured to sense a first temperature corresponding to at least a first transistor in a corresponding at least a first one of the memory cells in a first one of the organizational units, and a second sensing unit configured to sense a second temperature corresponding to at least a second transistor in a corresponding at least a second one of the memory cells in a second one of the organizational units; and a differentiated dynamic voltage and frequency scaling (DDVFS) device configured to perform the following including, for a first set of one or more of the memory cells which includes the first memory cell, controlling a temperature of the first set based on the first temperature and, for a second set of one or more of the memory cells which includes the second memory cell, controlling a temperature of the second set based on the second temperature.

In some embodiments, the DDVFS device further includes a temperature comparator configured to perform the following including comparing the first temperature against a first temperature-reference representing a maximum temperature thereby yielding first temperature-comparison results, and comparing the second temperature against the first temperature-reference thereby yielding second temperature-comparison results; and the DDVFS device is further configured to perform the following including: executing a scenario (A) including altering a frequency of a first clock based on the first temperature-comparison results, and altering a frequency of a second clock based on the second temperature-comparison results; or executing a scenario (B) including altering a value of a first power supply (PS) voltage based on the first temperature-comparison results, and altering the value of a second PS voltage based on the second temperature-comparison results.

In some embodiments, when the first temperature is below a second temperature-reference representing a moderate temperature, the DDVFS device is further configured to perform the following including increasing the frequency of the first clock or increasing the value of the first PS voltage; and, when the second temperature is below the second temperature-reference, the DDVFS device is further configured to perform the following including increasing the frequency of the second clock or increasing the value of the second PS voltage.

In some embodiments, when all members of the first set are idle, the DDVFS device is further configured to perform the following including reducing the frequency of the first clock or reducing the value of the first PS voltage; and, when all members of the second set are idle, the DDVFS device is further configured to perform the following including reducing the frequency of the second clock or reducing the value of the second PS voltage.

In some embodiments, a method (of controlling temperatures in a high bandwidth memory (HBM) that includes core dies, the HBM being arranged into portions, each of the portions including memory cells, the HBM further including sensing units arranged correspondingly within the portions) includes: from a first one of the sensing units arranged within the HBM, receiving a first threshold voltage corresponding to at least a first transistor in a corresponding at least a first one of the memory cells in a first one of the portions; from a second one of the sensing units arranged within the HBM, receiving a second threshold voltage corresponding to at least a second transistor in a corresponding at least a second one of the memory cells in a second one of the portions; for a first set of one or more of the memory cells which includes the first memory cell, controlling a temperature of the first set based on the first threshold voltage; and for a second set of one or more of the memory cells which includes the second memory cell, controlling a temperature of the second set based on the second threshold voltage.

In some embodiments, the method further includes: comparing the first threshold voltage against a first voltage-reference representing a minimum threshold-voltage thereby yielding first voltage-comparison results; comparing the second threshold voltage against the first voltage-reference thereby yielding second voltage-comparison results; and executing a scenario (A) or a scenario (B); and wherein the scenario (A) includes altering a frequency of a first clock based on the first voltage-comparison results and altering the frequency of a second clock based on the second voltage-comparison results; or the scenario (B) includes altering a value of a first power supply (PS) voltage based on the first voltage-comparison results and altering the value of a second PS voltage based on the second voltage-comparison results.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A system for controlling temperatures in a memory, the system comprising:
a high bandwidth memory (HBM) including core dies, the HBM being arranged into portions, each of the portions including memory cells, the HBM further including:
a first sensing unit configured to generate one or more first environmental signals corresponding to at least a first transistor in a corresponding at least a first one of the memory cells in a first one of the portions; and
a second sensing unit configured to generate one or more second environmental signals corresponding to at least a second transistor in a corresponding at least a second one of the memory cells in a second one of the portions; and
a differentiated dynamic voltage and frequency scaling (DDVFS) device configured to perform the following:
for a first set of one or more of the memory cells in the first portion which includes the first memory cell, controlling a temperature of the first set based on the one or more first environmental signals; and
for a second set of one or more of the memory cells in the second portion which includes the second memory cell, controlling a temperature of the second set based on the one or more second environmental signals.

2. The system of claim 1, wherein:
in terms of membership, the first and second sets are non-overlapping of each other.

3. The system of claim 1, wherein:
the first sensing unit is further configured to sense a first temperature or detect a first threshold voltage corresponding to the at least the first transistor in the corresponding at least one of the memory cells of the first set;
the second sensing unit is further configured to sense a second temperature or detect a second threshold voltage corresponding to the at least the second transistor in the corresponding at least one of the memory cells of the second set;
the one or more first environmental signals include the first temperature or the first threshold voltage;
the one or more second environmental signals include the second temperature or the second threshold voltage; and
the DDVFS device is further configured to perform the following:
adjusting a first clock or a first power supply (PS) voltage based on the first temperature or the first threshold voltage; and
adjusting a second clock or a second PS voltage based on the second temperature or the second threshold voltage.

4. The system of claim 3, wherein:
each of the portions includes banks;
the first set of one or more of the memory cells is contained within at least a first lot of one or more of the banks;
the second set of one or more of the memory cells is contained within at least a second lot of one of the banks;
in terms of membership, the first and second lots are non-overlapping of each other; and
the DDVFS device is further configured to perform the following:
adjusting the first clock or the first PS voltage of the first lot resulting in first bank-wide adjustment of corresponding temperatures amongst the memory cells of the banks of the first lot; and
adjusting the second clock or the second PS voltage of the second lot resulting in second bank-wide adjustment of corresponding temperatures amongst the memory cells of the banks of the second lot.

5. The system of claim 3, wherein:
each of the portions includes banks;
the banks of the HBM are arranged in corresponding groups;
the first set of one or more of the memory cells is contained within at least a first block of one or more of the groups;
the second set of one or more of the memory cells is contained within at least a second block of one or more of the groups;
in terms of membership, the first and second blocks are non-overlapping of each other; and
the DDVFS device is further configured to perform the following:
adjusting the first clock or the first PS voltage of the first block resulting in a first group-wide adjustment of temperatures amongst the memory cells of the groups of the first block; and
adjusting the second clock or the second PS voltage of the second block resulting in second group-wide adjustment of temperatures amongst the memory cells of the groups of the second block.

6. The system of claim 3, wherein:
each of the core dies of the HBM is arranged in channels;
the first set of one or more of the memory cells is contained within at least a first bundle of one or more of the channels;
the second set of one or more of the memory cells is contained within at least a second bundle of one or more of the channels;
in terms of membership, the first and second bundles are non-overlapping of each other; and
the DDVFS device is further configured to perform the following:
adjusting the first clock or the first PS voltage of the first bundle resulting in a first channel-wide adjustment of temperatures amongst the memory cells of the channels of the first bundle; and
adjusting the second clock or the second PS voltage of the second bundle resulting in a second channel-wide adjustment of temperatures amongst the memory cells of the channels of the second bundle.

7. The system of claim 3, wherein:
the first set of one or more of the memory cells is contained within a first collection of one or more of the core dies;
the second set of one or more of the memory cells is contained within a second collection of one or more of the core dies;
in terms of membership, the first and second collections are non-overlapping of each other; and
the DDVFS device is further configured to perform the following:
adjusting the first clock or the first PS voltage of the first collection resulting in a first core-die-wide adjustment of temperatures amongst the memory cells of the core dies of the first collection; and
adjusting the second clock or the second PS voltage of the second collection resulting in a second core-diewide adjustment of temperatures amongst the memory cells of the core dies of the second collection.

8. The system of claim 3, wherein the DDVFS device includes:
- a controller configured to perform the following:
  - a scenario (A) including:
    - altering a frequency of the first clock based on the first temperature from the first sensing unit; and
    - altering a frequency of the second clock based on the second temperature from the second sensing unit; or
  - a scenario (B) including:
    - altering a value of the first PS voltage based on the second temperature from the first sensing unit; and
    - altering a value of the second PS voltage based on the second temperature from the second sensing unit.

9. The system of claim 8, wherein:
the DDVFS device further includes:
- a temperature comparator configured to perform the following:
  - comparing the first temperature against a first temperature-reference representing a maximum temperature thereby yielding first temperature-comparison results; and
  - comparing the second temperature against the first temperature-reference thereby yielding second temperature-comparison results; and the controller is further configured to perform the following:
- executing a scenario (A) including:
  - altering the frequency of the first clock based on the first temperature-comparison results; and
  - altering the frequency of the second clock based on the second temperature-comparison results; or
- executing a scenario (B) including:
  - altering the value of the first PS voltage based on the first temperature-comparison results; and
  - altering the value of the second PS voltage based on the second temperature-comparison results.

10. The system of claim 9, wherein:
the temperature comparator is further configured to perform the following:
- comparing the first temperature against a second temperature-reference representing a moderate temperature thereby yielding third temperature-comparison results; and
- comparing the second temperature against the second temperature-reference thereby yielding fourth temperature-comparison results;

when the third temperature-comparison results indicate that the first temperature is below the second temperature-reference, the controller is further configured to perform the following:
- increasing the frequency of the first clock; or
- increasing the value of the first PS voltage; and when the second temperature-comparison results indicate that the second temperature is below the second temperature-reference, the controller is further configured to perform the following:
- increasing the frequency of the second clock; or
- increasing the value of the second PS voltage.

11. The system of claim 8, wherein:
the DDVFS device further includes:
- a threshold-voltage comparator configured to perform the following:
  - comparing the first threshold voltage against a voltage-reference representing a minimum threshold-voltage thereby yielding first voltage-comparison results; and
  - comparing the second threshold voltage against the voltage-reference thereby yielding second voltage-comparison results; and the controller is further configured to perform the following:
- executing a scenario (A) including:
  - altering the frequency of the first clock based on the first voltage-comparison results; and
  - altering the frequency of the second clock based on the second voltage-comparison results; or
- executing a scenario (B) including:
  - altering the value of the first PS voltage based on the first voltage-comparison results; and
  - altering the value of the second PS voltage based on the second voltage-comparison results.

12. The system of claim 8, wherein:
when all members of the first set are idle, the controller is configured to perform the following:
- reducing the frequency of the first clock; or
- reducing the value of the first PS voltage; and when all members of the second set are idle, the controller is configured to perform the following:
- reducing the frequency of the second clock; or
- reducing the value of the second PS voltage.

13. The system of claim 3, wherein each of the first and second sensing units includes:
- a bias current generator electrically coupled to a first node;
- a diode-configured transistor electrically coupled between the first node and a ground voltage; and
- a readout circuit electrically coupled to the first node and configured correspondingly to output the first or second temperature.

14. The system of claim 3, wherein each of the first and second sensing units includes:
- a proportional to absolute temperature (PTAT) current generator electrically coupled to a first node;
- a diode-configured transistor electrically coupled between the first node and a ground voltage; and
- wherein a voltage on the first node correspondingly represents the first or second threshold voltage.

15. A system for controlling temperatures in a memory, the system comprising:
- a high bandwidth memory (HBM) including core dies, the HBM being arranged into organizational units, each organizational unit including memory cells, the HBM further including:
  - a first sensing unit configured to sense a first temperature corresponding to at least a first transistor in a corresponding at least a first one of the memory cells in a first one of the organizational units; and
  - a second sensing unit configured to sense a second temperature corresponding to at least a second transistor in a corresponding at least a second one of the memory cells in a second one of the organizational units; and
- a differentiated dynamic voltage and frequency scaling (DDVFS) device configured to perform the following:
  - for a first set of one or more of the memory cells which includes the first memory cell, controlling a temperature of the first set based on the first temperature; and for a second set of one or more of the memory cells which includes the second memory cell, controlling a temperature of the second set based on the second temperature.

16. The system of claim 15, wherein:
the DDVFS device further includes:
a temperature comparator configured to perform the following:
comparing the first temperature against a first temperature-reference representing a maximum temperature thereby yielding first temperature-comparison results; and
comparing the second temperature against the first temperature-reference thereby yielding second temperature-comparison results; and
the DDVFS device is further configured to perform the following:
executing a scenario (A) including:
altering a frequency of a first clock based on the first temperature-comparison results; and
altering a frequency of a second clock based on the second temperature-comparison results; or
executing a scenario (B) including:
altering a value of a first power supply (PS) voltage based on the first temperature-comparison results; and
altering the value of a second PS voltage based on the second temperature-comparison results.

17. The system of claim 16, wherein:
when the first temperature is below a second temperature-reference representing a moderate temperature, the DDVFS device is further configured to perform the following:
increasing the frequency of the first clock; or
increasing the value of the first PS voltage; and
when the second temperature is below the second temperature-reference, the DDVFS device is further configured to perform the following:
increasing the frequency of the second clock; or
increasing the value of the second PS voltage.

18. The system of claim 16, wherein:
when all members of the first set are idle, the DDVFS device is further configured to perform the following:
reducing the frequency of the first clock; or
reducing the value of the first PS voltage; and
when all members of the second set are idle, the DDVFS device is further configured to perform the following:
reducing the frequency of the second clock; or
reducing the value of the second PS voltage.

19. A method of controlling temperatures in a high bandwidth memory (HBM) that includes core dies, the HBM being arranged into portions, each of the portions including memory cells, the HBM further including sensing units arranged correspondingly within the portions, the method comprising:
from a first one of the sensing units arranged within the HBM, receiving a first threshold voltage corresponding to at least a first transistor in a corresponding at least a first one of the memory cells in a first one of the portions;
from a second one of the sensing units arranged within the HBM, receiving a second threshold voltage corresponding to at least a second transistor in a corresponding at least a second one of the memory cells in a second one of the portions;
for a first set of one or more of the memory cells which includes the first memory cell, controlling a temperature of the first set based on the first threshold voltage; and
for a second set of one or more of the memory cells which includes the second memory cell, controlling a temperature of the second set based on the second threshold voltage.

20. The method of claim 19, further comprising:
comparing the first threshold voltage against a first voltage-reference representing a minimum threshold-voltage thereby yielding first voltage-comparison results;
comparing the second threshold voltage against the first voltage-reference thereby yielding second voltage-comparison results; and
executing a scenario (A) or a scenario (B); and
wherein:
the scenario (A) includes:
altering a frequency of a first clock based on the first voltage-comparison results; and
altering the frequency of a second clock based on the second voltage-comparison results; or
the scenario (B) includes:
altering a value of a first power supply (PS) voltage based on the first voltage-comparison results; and
altering the value of a second PS voltage based on the second voltage-comparison results.

* * * * *